United States Patent
Hsu et al.

(10) Patent No.: US 7,246,342 B2
(45) Date of Patent: Jul. 17, 2007

(54) ORIENTATION DEPENDENT SHIELDING FOR USE WITH DIPOLE ILLUMINATION TECHNIQUES

(75) Inventors: Stephen Duan-Fu Hsu, Freemont, CA (US); Noel Corcoran, San Jose, CA (US); Jang Fung Chen, Cupertino, CA (US)

(73) Assignee: ASML Masktools B.V., Veldhoven (NL)

( * ) Notice: Subject to any disclaimer, the term of this patent is extended or adjusted under 35 U.S.C. 154(b) by 165 days.

(21) Appl. No.: 10/626,858

(22) Filed: Jul. 25, 2003

(65) Prior Publication Data

US 2005/0102648 A1   May 12, 2005

Related U.S. Application Data

(63) Continuation-in-part of application No. 10/395,903, filed on Mar. 25, 2003, now Pat. No. 6,851,103.

(60) Provisional application No. 60/398,574, filed on Jul. 26, 2002.

(51) Int. Cl.
*G06F 17/50* (2006.01)
(52) U.S. Cl. .......................................... 716/19; 716/21
(58) Field of Classification Search .................. 716/21, 716/1–19, 20
See application file for complete search history.

(56) References Cited

U.S. PATENT DOCUMENTS

| | | | |
|---|---|---|---|
| 5,841,517 A | 11/1998 | Tanibata | |
| 5,881,125 A | 3/1999 | Dao | |
| 6,553,562 B2 | 4/2003 | Capodieci et al. | |
| 6,625,802 B2 | 9/2003 | Singh et al. | |
| 6,851,103 B2 | 2/2005 | Van Den Broeke et al. | |
| 6,875,545 B2 | 4/2005 | Eurlings et al. | |
| 6,915,505 B2 | 7/2005 | Hsu et al. | |
| 2002/0045136 A1* | 4/2002 | Fritze et al. | 430/322 |
| 2002/0166107 A1 | 11/2002 | Van Os | |

(Continued)

FOREIGN PATENT DOCUMENTS

EP    1 091 252 A2   4/2001

(Continued)

OTHER PUBLICATIONS

Hsu, Stephen D., et al. "65 nm Full-chip implementation Using Double Dipole Lithography." Optical Microlithography XVI, Santa Clara, California, USA, Feb. 2003, Proceedings of the SPIE- The International Society for Optical Engineering, pp. 215-231, XP 009024366, ISSN: 0277-786X.

(Continued)

*Primary Examiner*—Paul Dinh
*Assistant Examiner*—Suchin Parihar
(74) *Attorney, Agent, or Firm*—McDermott Will & Emery LLP

(57) ABSTRACT

A method of printing a pattern having vertically oriented features and horizontally oriented features on a substrate utilizing dipole illumination, which includes the steps of: identifying background areas contained in the pattern; generating a vertical component mask comprising non-resolvable horizontally oriented features in the background areas; generating a horizontal component mask comprising non-resolvable vertically oriented features in the background areas; illuminating said vertical component mask utilizing an X-pole illumination; and illuminating said horizontal component mask utilizing a Y-pole illumination.

26 Claims, 16 Drawing Sheets

U.S. PATENT DOCUMENTS

2003/0223050 A1* 12/2003 Fritze et al. .................. 355/51
2004/0259042 A1* 12/2004 Fritze et al. ................. 430/394

FOREIGN PATENT DOCUMENTS

EP          1 152 289 A2   11/2001
EP          1 152 289 A3   11/2001

OTHER PUBLICATIONS

Hsu, Stephen D., et al. "Dipole Decomposition Mask-design for full Chip Implementation at the 100nm Technology Node and Beyond." Proceedings of the SPIE, US, vol. 4691, pp.476-490, XP 002261072, ISSN: 0277-786X.

Torres, J.A., et al. "Model Assisted Double Dipole Decomposition." Proceedings of the SPIE, vol. 4691, pp. 407-417, XP 002257323 ISSN: 0277-786X.

Lim, Chang-Moon., et al. "Intra-field CD Variation by Stray Light from Neighboring Field." Optical Microlithography XV, Santa Clara, California, USA, Mar. 2002, Proceedings of the SPIE- The International Society for Optical Engineering, 2002, pp. 1412-1420, XP 002268484, ISSN: 0277-786X.

"Mask Topography Effects in Projection Printing of Phase-Shifting Masks", Alfred K. Wong and Andrew R. Neureuther, Fellow, IEEE Transactions on Electron Devices, vol. 41, No. 6, Jun. 1994.

"Spatial Frequency Doubling Lithography (SFDL) of Periodic Structures for Integrated Optical Circuit Technology", Tanya E. Jewell and Donald L. White. Journal of Lightwave Technology, vol. 7, No. 9, Sep. 1989.

Austrian Examination Report issued in corresponding Singapore Patent Application No. 200303894-0, dated Jan. 19, 2007.

* cited by examiner

| PATTERN | COVERED AREA (SQ MICRONS) | TOTAL AREA PATTERN FILE (SQ MICRONS) | % COVERAGE |
|---|---|---|---|
| TARGET | 15.80638 | 173.39989 WAFFDPTGT.PF : TARGET LAYER | 9 |
| TARGET W RULE BASED OPC | 30.08119 | 176.78820 HNOWAFFLE.PF: HORIZONTAL NO WAFF | 17.3 |
| TARGET W RULE BASED OPC | 24.16783 | 176.78820 VNOWAFFLE.PF : VERTICAL NO WAFF | 13.6 |
| RULE-BASED OPC + IDWS | 61.05581 | 176.78820 WAFFDPXHZ.PF: HORIZONTAL WITH WAFF | 35 |
| RULE-BASED OPC + IDWS | 53.34173 | 176.78820 WAFFDPXVT.PF : VERTICAL WITH WAFF | 30 |

TABLE 1: COMPARISON OF AREA COVERAGE FOR PATTERNS WITH DIFFERENT TREATMENT.

FIG. 11

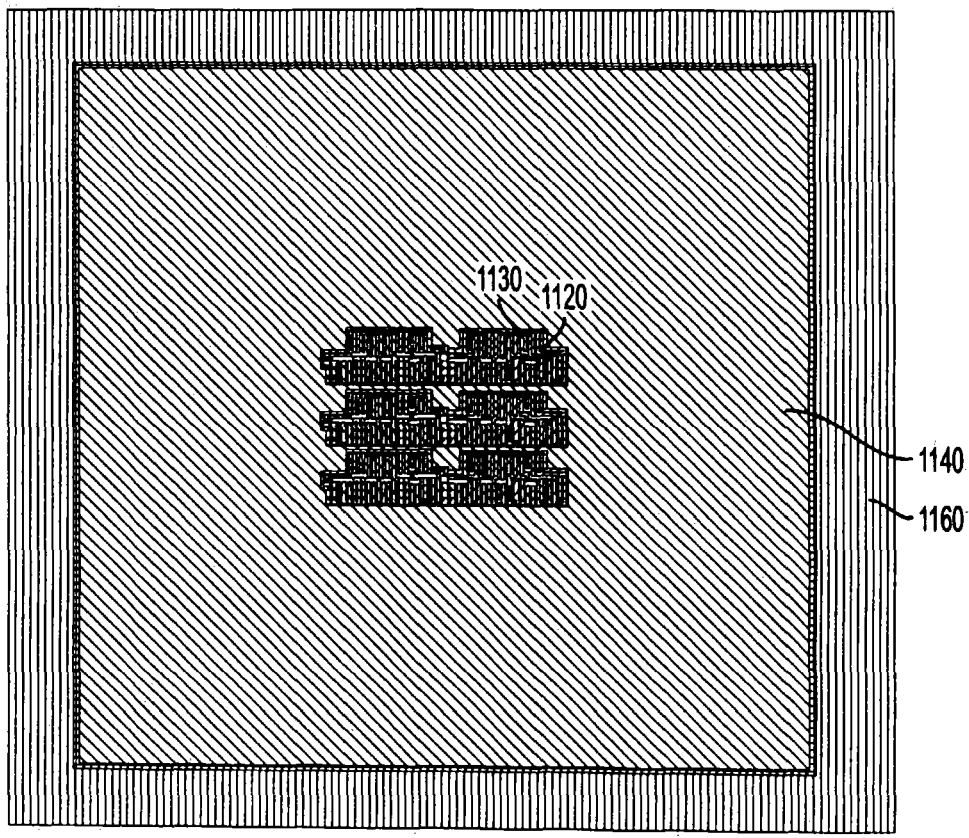

FIG. 12A

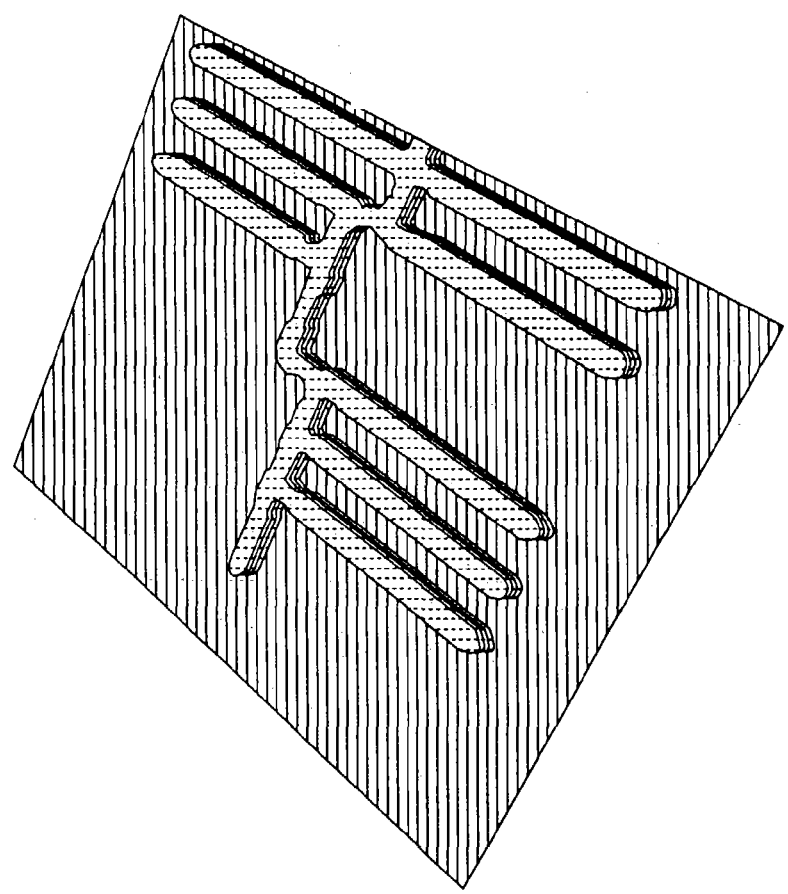
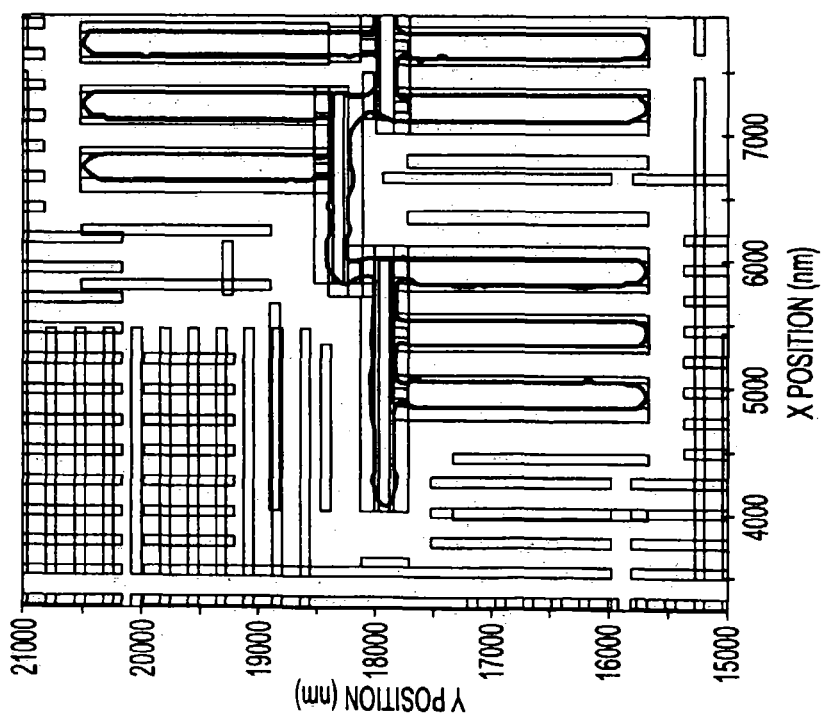
FIG. 13B
FIG. 13A

ORIENTATION DEPENDENT SHIELDING FOR USE WITH DIPOLE ILLUMINATION TECHNIQUES

RELATED APPLICATIONS

This application is a Continuation-In-Part of U.S. Pat. application Ser. No. 10/395,903, filed Mar. 25, 2003, now U.S. Pat. No. 6,851,103 and claims priority of United States Provisional Patent Application No. 60/398,574, filed Jul. 26, 2002, the entire contents of which are incorporated herein by reference.

FIELD OF THE INVENTION

The present invention relates to photolithography, and in particular relates to the generation of mask layouts, for use with dipole illumination techniques, that provide for a reduction in the loss of image contrast caused by lens flare, which can be significant when utilizing dipole illumination due to the multiple exposures. In addition, the present invention relates to a device manufacturing method using a lithographic apparatus comprising a radiation system for providing a projection beam of radiation; a mask table for holding a mask, serving to pattern the projection beam; a substrate table for holding a substrate; and a projection system for projecting the patterned projection beam onto a target portion of the substrate.

BACKGROUND OF THE INVENTION

Lithographic projection apparatus (tools) can be used, for example, in the manufacture of integrated circuits (ICs). In such a case, the mask contains a circuit pattern corresponding to an individual layer of the IC, and this pattern can be imaged onto a target portion (e.g. comprising one or more dies) on a substrate (for example, but not limited to a silicon wafer) that has been coated with a layer of radiation-sensitive material (resist). In general, a single wafer will contain a whole array of adjacent target portions that are successively irradiated via the projection system, one at a time. In one type of lithographic projection apparatus, each target portion is irradiated by exposing the entire reticle pattern onto the target portion in one go; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally<1), the speed V at which the substrate table is scanned will be a factor M times that at which the mask table is scanned. More information with regard to lithographic apparatus as here described can be gleaned, for example, from U.S. Pat. No. 6,046,792, incorporated herein by reference.

In a manufacturing process using a lithographic projection apparatus, a mask pattern is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole-procedure, or a variant thereof, will have to be repeated for each new layer. Eventually, an array of devices will be present on the substrate (wafer). These devices are then separated from one another, by a technique such as dicing or sawing. Thereafter, the individual devices can be mounted on a carrier, connected to pins, etc. Further information regarding such processes-can be obtained, for example, from the book "Microchip Fabrication: A Practical Guide to Semiconductor Processing", Third-Edition, by Peter van Zant, McGraw Hill Publishing Co., 1997, ISBN 0-07-067250-4, incorporated herein by reference.

The lithographic tool may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic tools are described, for example, in U.S. Pat. No. 5,969,441 and WO 98/40791, incorporated herein by reference.

The photolithography masks referred to above comprise geometric patterns corresponding to the circuit components to be integrated onto a silicon wafer. The patterns used to create such masks are generated utilizing CAD (computer-aided design) programs, this process often being referred to as EDA (electronic design automation). Most CAD programs follow a set of predetermined design rules in order to create functional masks. These rules are set by processing and design limitations. For example, design rules define the space tolerance between circuit devices (such as gates, capacitors, etc.) or interconnect lines, so as to ensure that the circuit devices or lines do not interact with one another in an undesirable way.

Of course, one of the goals in integrated circuit fabrication is to faithfully reproduce the original circuit design on the wafer (via the mask). Another goal is to use as much of the semiconductor wafer real estate as possible. As the size of an integrated circuit is reduced and its density increases, however, the CD (critical dimension) of its corresponding mask pattern approaches the resolution limit of the optical exposure tool. The resolution for an exposure tool is defined as the minimum feature that the exposure tool can repeatedly expose on the wafer. The resolution value of present exposure equipment often constrains the CD for many advanced IC circuit designs.

Furthermore, the constant improvements in microprocessor speed, memory packing density and low power consumption for micro-electronic components are directly related to the ability of lithography techniques to transfer and form patterns onto the various layers of a semiconductor device. The current state of the art requires patterning of CD's well below the available light source wavelengths. For instance the current production wavelength of 248 nm is being pushed towards patterning of CD's smaller than 100 nm. This industry trend will continue and possibly accelerate in the next 5–10 years, as described in the International Technology Roadmap for Semiconductors (ITRS 2000).

This continued demand for improved performance has resulted in the development of various techniques aimed at improving resolution. Such techniques are typically referred to as Resolution Enhancement Techniques (RET's) and comprise a very wide range of applications. Examples include: light source modifications (e.g. Off-Axis Illumination), use of special masks, which exploit light interference phenomena (e.g. Attenuated Phase Shift Masks, Alternating Phase Shift Masks, Chromeless Masks, etc.), and mask layout modifications (e.g. Optical Proximity Corrections).

Of the foregoing techniques, dipole illumination is one of the most attractive T candidates due to its high image contrast for dense pitches and superior resolution capabilities. As is known, dipole illumination is an extreme case of OAI and is capable of providing enhanced imaging contrast with improved process latitude for very low $K_1$ imaging.

However, one of the limitations associated with dipole illumination is that a single illumination only enhances resolution for features that are orthogonal to the illumination pole axis. As a result, in order to take full advantage of dipole illumination during wafer printing, the mask pattern must be decomposed into horizontal and vertical orientations. Once the mask pattern is converted in this manner, a Y-pole exposure is utilized to image the horizontally oriented features, and a X-pole exposure is utilized to image the vertically oriented features. One important aspect of dipole illumination is that when imaging the horizontally oriented features, the vertically oriented features must be protected (i.e., shielded) so the vertically oriented features are not degraded. The opposite is true when vertically oriented features are imaged (i.e., the horizontally oriented features must be protected).

FIG. 1 illustrates the basic concepts of double dipole imaging. As stated, typically there are at least two exposures when utilizing dipole illumination. In the first exposure, the X dipole aperture 10 provides a maximum aerial image intensity (i.e., maximum modulation) for the vertical portion of the lines 12 to be printed. The resulting image profile is illustrated by line 24 in FIG. 1. In the second exposure, which utilizes the Y-dipole aperture 16, there is no image modulation for lines 12. It is noted, however, that during the second exposure using the Y-dipole aperture, the vertical portions of the lines 12 need to be shielded so that the vertical features formed during the first exposure are not degraded during the second exposure. FIG. 1 illustrates shielding the lines 12 with shields 15, each of which is 20 nm wide in the horizontal direction. As a result, when exposing the horizontal lines using the Y dipole aperture, there is substantially no imaging (i.e., modulation) of the vertical features 12. The aerial image is a DC modulation as shown by line 17 in FIG. 1, which corresponds to the 20 nm shielding. The final aerial image intensity, which is represented by line 14 in FIG. 1, corresponds to the sum of the first exposure using the X dipole aperture and the second exposure using the Y dipole aperture.

It is further noted that, assuming the exposure energy is constant, increasing the width of the shielding from a 20 nm shield 15 to a 40 nm shield 20 for the vertical lines 12 causes the minimal intensity level of the resulting image to shift to a lower level. This, is represented by line 22 in FIG. 1, which rep resents the aerial image associated with the vertical portions of the features. As shown, the aerial image 22 is just a DC modulation. However, it is lower than the DC modulation 17 associated with the 20 nm shield. As a result, the composite image 19 formed utilizing the 40 nm shielding provides better imaging results than the composite image 14 formed utilizing the 20 nm shielding.

As a result of the need to separate the horizontally and vertically oriented features, one of the challenges for the lithographer, when utilizing dipole illumination, is determining how to convert the original IC design data into its horizontal or vertical pattern components and generate two masks for the dual exposure process that can take full advantage of the dipole imaging performance. One factor that reduces performance and which should be considered when generating the mask patterns is background light due to lens flare or scattering. As: is known, lens flare results in unwanted background light (i.e., noise) that degrades the image contrast at the image plane. Thus, it is desirable to reduce "flare" as much as possible. This is especially true when utilizing dipole illumination techniques due to the multiple exposures associated therewith.

The "aerial image with flare" is equal to the "aerial image without flare" convolved with a point-spread function (PSF) plus the scattering. The foregoing can be expressed as:

$$I_{flare}(x, y) = I_{noflare} PSF_{flare} + I_{noflare}(I-TIS) \quad (1)$$

where TIS is the total integrated scattering (TIS) for lens having a surface roughness with a Gaussian like distribution. Under such conditions, TIS can be expressed as:

$$TIS = [(4\pi\sigma \cos\theta)/\lambda]^2 \quad (2)$$

where $\lambda$ is the wavelength of the exposure tool, $\sigma$ is the rms roughness of the lens, and $\theta$ is the scattering angle. As a result of current lens making capabilities, which result in lens exhibiting extremely low surface roughness, the foregoing equation can be approximated as:

$$TIS \sim 1/\lambda^2 \quad (3)$$

Equation (3) makes clear that as the wavelength of the exposure tool is reduced, the amount of scattered light increases significantly. For example, the total integrated scattering (TIS) of light for an exposure tool having a wavelength of 193 nm is approximately 1.65 times greater that the TIS associated with an exposure tool having a wavelength of 248 nm.

It is noted that the first term is equation (1) is the "diffuse halo" which causes the focused image to spread out. The second term in equation (1) is the contribution due to scattering. The overall effect is an unwanted DC background light that reduces the aerial image contrast. Furthermore, besides the negative impact on image contrast, flare is also unevenly distributed across the scanning slit and is not uniform with the exposure field, which can cause intrafield CD variations. Therefore, protecting features and reducing background stray light becomes increasingly critical. The issue of how to reduce or negate the effects of background stray light becomes even more important as the wavelengths of the exposure tools are reduced.

Currently, one known technique for reducing the negative effects of flare comprises the step of adding solid chrome shielding on the large areas of the mask pattern (i.e., background portions) that do not contain any geometry (i.e., features). As shown in FIGS. 2a and 2b, when utilizing dipole illumination, the solid chrome shielding, referred to as background light shielding (BLS), is applied to the background areas in both the horizontal mask and the vertical mask. The solid chrome shield functions to protect the background, area during both exposures. FIG. 2a illustrates an example of the use of this shielding technique in conjunction with the printing 6f horizontally oriented features 29 utilizing the Y dipole 16. As-shown in FIG. 2a, each of the vertical features 27 are provided with shielding 210 (i.e., main feature shielding) in the manner discussed above in conjunction with FIG. 1. In addition, the solid chrome shield 220 is provided in the background area where there are no features to be imaged on the wafer. In a similar manner, FIG. 2b illustrates the vertical mask, in which the horizontal oriented features are shielded, while the vertical features are printed. As shown, the vertical mask also includes a solid chrome shield 220 disposed in the background area. It is further noted that both the horizontal mask and the vertical mask contain assist features 103 (e.g., scatter bars).

However, as a result of such background shielding 220, when utilizing a positive resist, the intensity in the background areas becomes too low to completely clear the resist. FIGS. 3*a* and 3*b* illustrate a simulated resist pattern corresponding to the portion of the masks of FIGS. 2*a* and 2*b* defined by area 30, which includes the solid chrome shielding 220. The simulation was performed assuming NA(numerical aperture)=0.75, ArF double exposure x-pole, y-pole, $\sigma_{outer}/\sigma_{inner}$=0.89/0.65. As is shown by FIGS. 3*a* and 3*b*, portions of the resist 221 in the background areas remain after illumination using the vertical and horizontal masks. As a result, a third exposure utilizing a trim mask is necessary in order to completely remove the resist from the background shielded areas. Thus, such a solution for reducing the effects of flare is undesirable as it results in an increase in the number of exposures and masks required for imaging the wafer. Referring to FIG. 3*a*, the areas indicated by reference numeral 51 correspond to the areas where resist remains after the double exposures, and these areas are contrasted against areas of either the vertical or horizontal mask that had chrome disposed thereon (i.e., either feature or shielding).

Furthermore, the foregoing solid chrome shielding technique can also negatively interfere with assist features, such as scatter bars, and cause the assist features to print underneath the shielding of either the horizontal or vertical mask, as-also illustrated in FIGS. 3*a* and 3*b*. For example, referring to FIG. 3*b*, as shown in the resist simulation, the assist features 103, which are intended to be sub-resolution, are printed as a result of the BLS 220. This problem imposes an additional constraint on the placement of assist features, which can prevent the assist features from being placed in the optimal position, thereby causing a reduction in printing performance.

Accordingly, there exists a need for a method for negating the effects of flare in the exposure process which does not result in an increase in the number of exposures and masks required for imaging the wafer, and which does not impact the use and/or placement of assist features in the mask.

SUMMARY OF THE INVENTION

In an effort to solve the foregoing needs, it is one object of the present invention to provide a shielding technique that does not result in an increase in the number of exposures or masks required for imaging the wafer, and that does not impact the use and/or placement of assist features with the mask design.

More specifically, in one exemplary embodiment, the present invention relates to a method of printing a pattern having vertically oriented features and horizontally oriented features on a substrate utilizing dipole illumination, which includes the steps of: identifying background areas contained in the pattern; generating a vertical component mask comprising non-resolvable horizontally oriented features in the background areas; generating a horizontal component mask comprising non-resolvable vertically oriented features in the background areas; illuminating said vertical component mask utilizing an X-pole illumination; and illuminating said horizontal component mask utilizing a Y-pole illumination. As explained in detail below, the non-resolvable features added to the background portion of the mask patterns function to reduce the background light incident on the wafer and negate the effects of lens flare.

Although specific reference may be made in this text to the use of the invention in the manufacture of ICs, it should be explicitly understood that the invention has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5–20 nm).

The term mask as employed in this text may be broadly interpreted as referring to generic patterning means that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning means include:

a) A programmable mirror array. An example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. The required matrix addressing can be performed using suitable electronic means. More information on such mirror arrays can be gleaned, for example, from U.S. Pat. No. 5,296,891 and U.S. Pat. No. 5,523,193; which are incorporated herein by reference.

b) A programmable LCD array. An example of such a construction is given in U.S. Pat. No. 5,229,872, which is incorporated herein by reference.

The method of the present invention provides important advantages over the prior art. For example, the present invention provides a simple method for reducing the negative effects associated with lens flare without increasing the number of masks necessary to print the desired pattern. In addition, the method of the present invention provides background shielding in such a manner that it does not effect the placement or use of assist features with the mask.

Furthermore, the flare reduction method of the present invention is easily integrated into the current design flow, does not result in reticle manufacturability issues, and has minimum data volume impact.

The present invention further provides a methodology to reduce the impact of flare and produce better process latitude and provide CD control and improve device performance.

Additional advantages of the present invention will become apparent to those skilled in the art from the following detailed description of exemplary embodiments of the present invention.

The invention itself, together with further objects and advantages, can be better understood by reference to the following detailed description and the accompanying drawings.

BRIEF DESCRIPTION OF THE DRAWINGS

FIG. 11 contains a table which summarizes the increase in pattern coverage for the various patterns illustrated in FIGS. 8–10.

FIGS. 12a and 12b illustrate the results of an aerial image simulation utilizing the vertical and horizontal masks shown in FIGS. 10a and 11b containing SGB shielding of the present invention in the double dipole exposure process.

FIGS. 13a and 13b illustrate the results of a full resist model simulation for the portion of the mask pattern contained in area 30 as illustrated in FIGS. 2a and 2b.

DETAILED DESCRIPTION OF THE INVENTION

In accordance with the present invention, the negative effects of lens flare are significantly reduced by utilizing a sub-resolution grating block (SGB) in the background areas of the mask design. As explained in more detail below, the SGB comprises a plurality of non-resolvable shielding lines disposed in the background portion of the mask, which have an orientation orthogonal to the features being imaged by the given mask. The non-resolvable shielding lines do not print on the wafer, but do provide the necessary shielding effect required to eliminate the effects of flare.

Prior to a description of exactly how the SGB is applied to a given mask, a brief explanation regarding the theory behind the present invention is provided. In order to reduce the background light level, it is necessary to control the amount of the zero order (i.e., DC level) light transmitted by the reticle. Long-range flare does not vary over lateral-distances comparable to the wavelength (>0.5 mm), so the irradiance can be expressed as:

$$I_{flare}(x, y) = I_{noflare}(r) + I_{background} + I_2 \text{nd-exp} \quad (4)$$

where $I_{flare}(x,y)$ is irradiance in the image plane with flare, $I_{noflare}(x,y)$ Is the irradiance in absence of long-range flare, and $I_{background}$ is the constant background intensity. $I_{2nd-exp}$ is the irradiance introduced by the second exposure, and it is constant background irradiance. Based on the foregoing, it is seen that it is critical to minimize the impact Of $I_{background}$ and $I_{2nd-exp}$ for clear filed DDL in order to improve the aerial image contrast.

Figure 4:
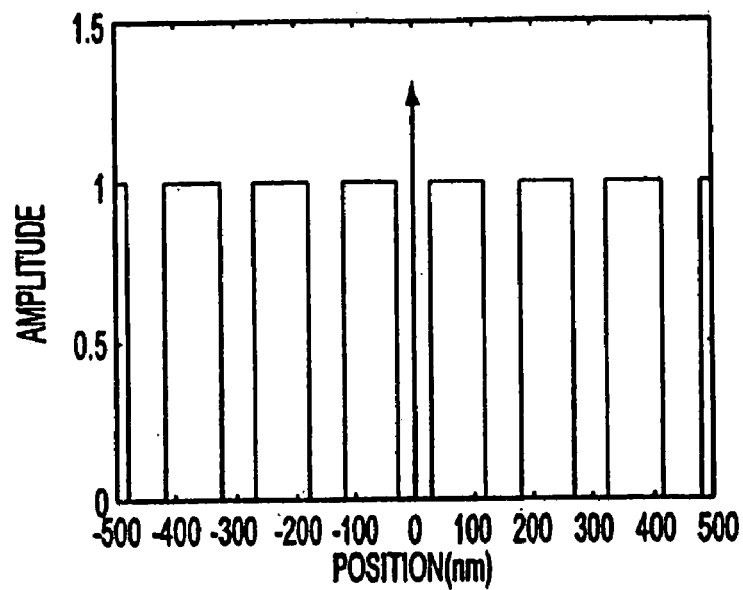
FIG. 4 illustrates the binary intensity mask transmission of an infinite grating.

Referring to FIG. 4, for an infinite grating on a clear field binary intensity mask, the mask transmission can be expressed as:

$$m(x) = 1 - \sum_{-\infty}^{\infty} rect\left(\frac{x-np}{w}\right) = 1 - \frac{1}{p} rect\left(\frac{x}{w}\right) \otimes comb\left(\frac{x}{p}\right) \quad (5)$$

From Fourier optics, the intensity transmitted by the mask forms a distribution in the pupil plane, which is proportional to the mask spectrum. The electric field for a point source is given by equation (6) and the intensity is, given by equation (7) as follows:

$$E(x, y) = F[P(f_x, f_y)F(t(x, y))] \quad (6)$$

$$I(x, y) = E(x, y)E^*(x, y) \quad (7)$$

where $t(x,y)$ is the transmission function and $F(t(x,y))$ is the mask spectrum that directly contributes to the electric field. F is the Fourier transform, F is the inverse transform, P is the pupil function, $f_x$ and $f_y$ are frequency coordinates, E is the electric filed, and I is the intensity at the image plane. Taking the Fourier transform of equation (5), the result is:

$$F\{m(x)\} = \frac{1}{\lambda} \int_{-\infty}^{\infty} m(x) \exp\left[-j2\pi \frac{k_x}{\lambda} x\right] dx \quad (8)$$

$$= \frac{1}{\lambda}\left[\delta(k_x) - \frac{w}{p}\frac{\sin(\pi k_x w)}{\pi k_x w} \times \sum_{-\infty}^{\infty}\left(k_x - \frac{m}{p/\lambda}\right)\right]$$

$$\text{0th\_order}, m=0, k_x=0 \Rightarrow F(k_x) = \frac{1}{\lambda}\left(1 - \frac{w}{p}\right) \quad (9)$$

$$\text{1st\_order}, m=1, k_x=\frac{\lambda}{p} \Rightarrow F(k_x) = \frac{1}{\lambda}\left(\frac{1}{\pi}\sin\left(\pi\frac{w}{p}\right)\right)$$

Equation (9) illustrates that the amount of background zero order (DC) light is adjustable by varying the width and pitch of an infinite grating.

Accordingly, a solution for minimizing flare without resorting to solid background shielding is to use a series of sub-resolution gratings that function to "block" the background DC that is the main cause of the unwanted stray light. As shown by equation (9), it is possible to minimize the background DC by tuning the width and pitch of the sub-resolution gratings.

It is further noted that by placing the shielding lines orthogonal to the features being imaged, the likelihood of the shielding lines being printed on the wafer is virtually zero, as the SGB lines parallel to the pole orientation has only a DC component.

Figure 5A:
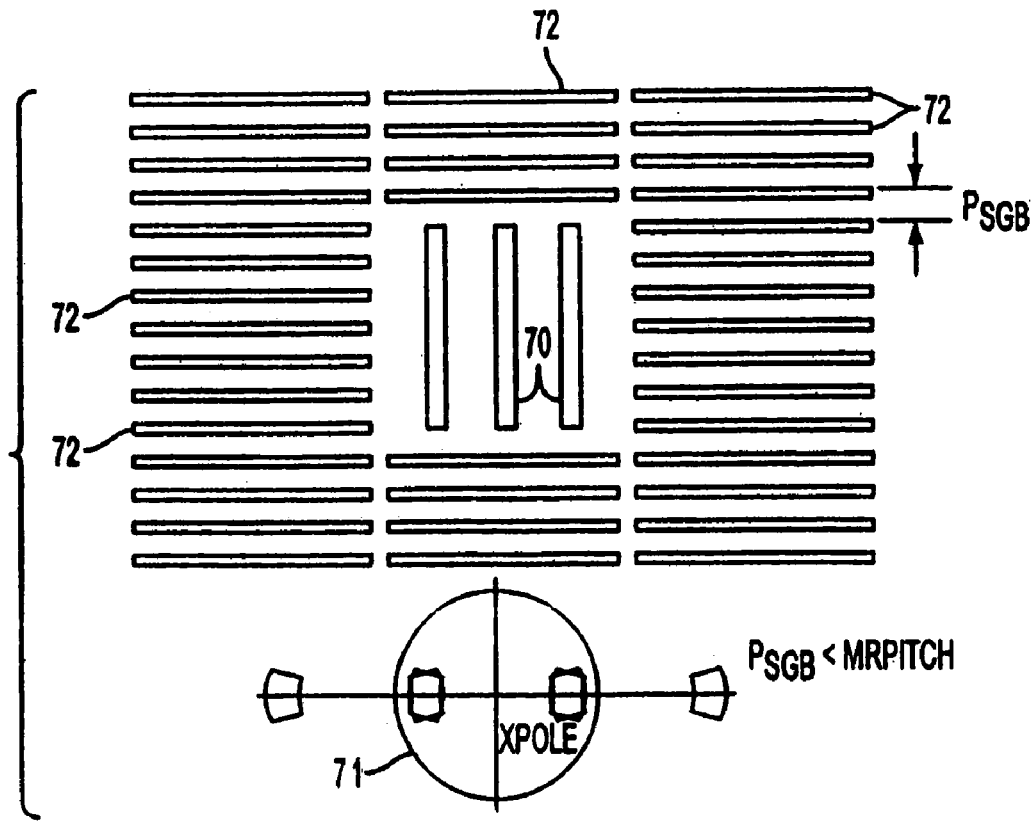
FIGS. 5a and 5b illustrate the use of sub-resolution grating blocks (SGB) of the present invention in conjunction with dipole illumination.
Figure 5B:
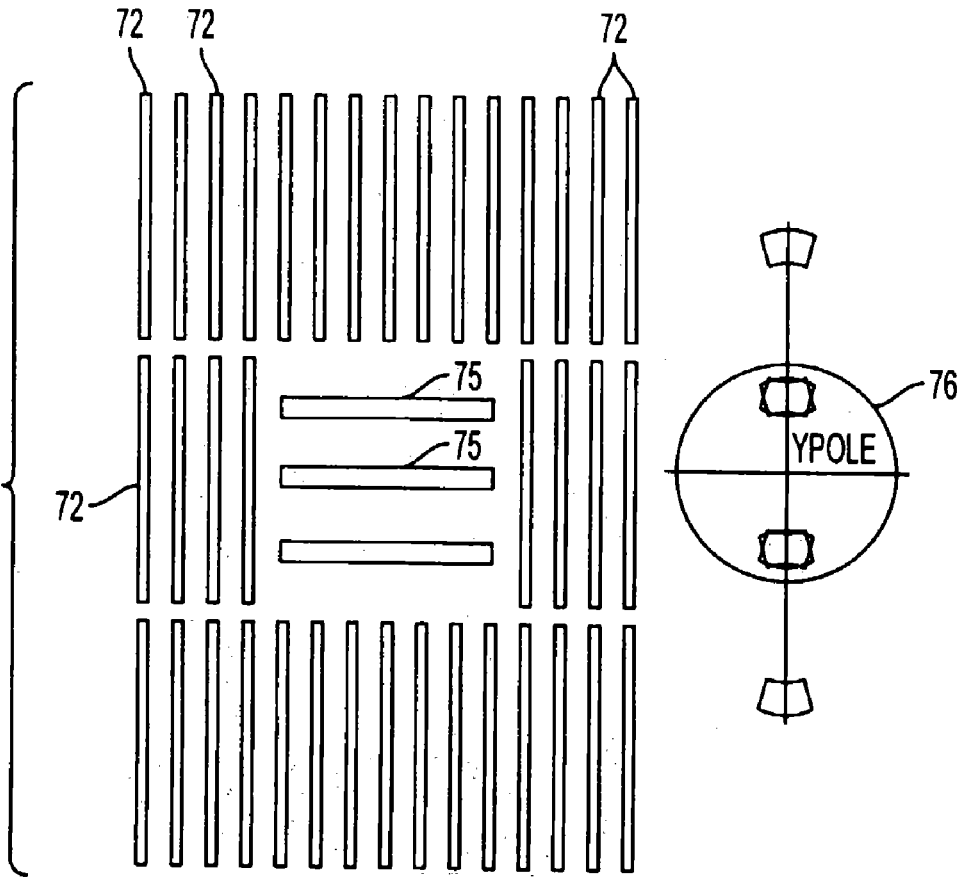

FIGS. 5a and 5b illustrate the use of the sub-resolution grating block (SGB) of the present invention in conjunction with dipole illumination. When printing vertical features 70 utilizing the x dipole 71 as shown in FIG. 5a, non-resolvable shielding line 72 are disposed in the background portion of the mask pattern. The non-resolvable shielding lines 72 are disposed orthogonal (i.e., horizontally) to the vertical features 70 to be printed. Similarly, as shown in FIG. 5b, when printing horizontal features 75 utilizing the y dipole 76, non-resolvable shielding lines 72 are disposed orthogonal (i.e., vertically) to the horizontal features 75 to be printed.

It is noted that the pitch and width of the lines of the SGB can be tuned to minimize the background DC. Specifically, as explained below, in the given embodiment, the minimum pitch of the lines of the SGB is calculated utilizing Equation 10, and thereafter a simulation is performed to select and optimize the width of the SGB lines. It is noted that a simulation is preferably utilized to determine the width of the lines due to the fact that the whether or not the SGB lines will print is resist process dependent.

Figure 6:
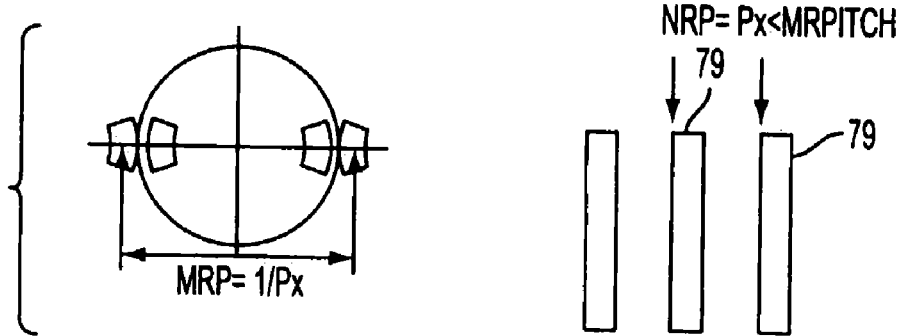
FIG. 6 illustrates an example of the calculation of the minimum resolvable pitch for the SGB.

As stated, the pitch of the shielding lines 72 is such that the shielding lines are not imaged on the wafer. As is known, if without the zero order, for image formation at least the $+/-1^{st}$ diffraction orders must be captured by the lens. Accordingly, a grating comprising a plurality of lines having a pitch, below the minimum resolvable pitch (MRP) below the cut-off frequency of the imaging system cannot be resolved. The minimum resolvable pitch is defined as:

$$MRP = k_1[\lambda/(NA(1+\sigma))] \quad (10)$$

where $k_1$ is a process dependent constant, NA is the numerical aperture, $\lambda$ is the wavelength of the imaging light and car is the outer sigma or partial coherence. FIG. 6 illustrates an example of a MRP calculation. For an ArF system having a numerical aperture of 0.75, the minimum resolvable pitch is 138 nm. If the pitch between lines 79 is less than this amount, the lines are non-resolvable by the imaging system, and therefore will not be printed on the wafer. As such, utilizing this example, the pitch of the shielding lines 72 would be less than 138 nm in order to maintain the shielding lines non-resolvable. It is noted that there is no rule governing the length of the shielding lines 72. The shielding lines 72 can extend across the entire exposure field if unobstructed by geometry.

Figure 7:
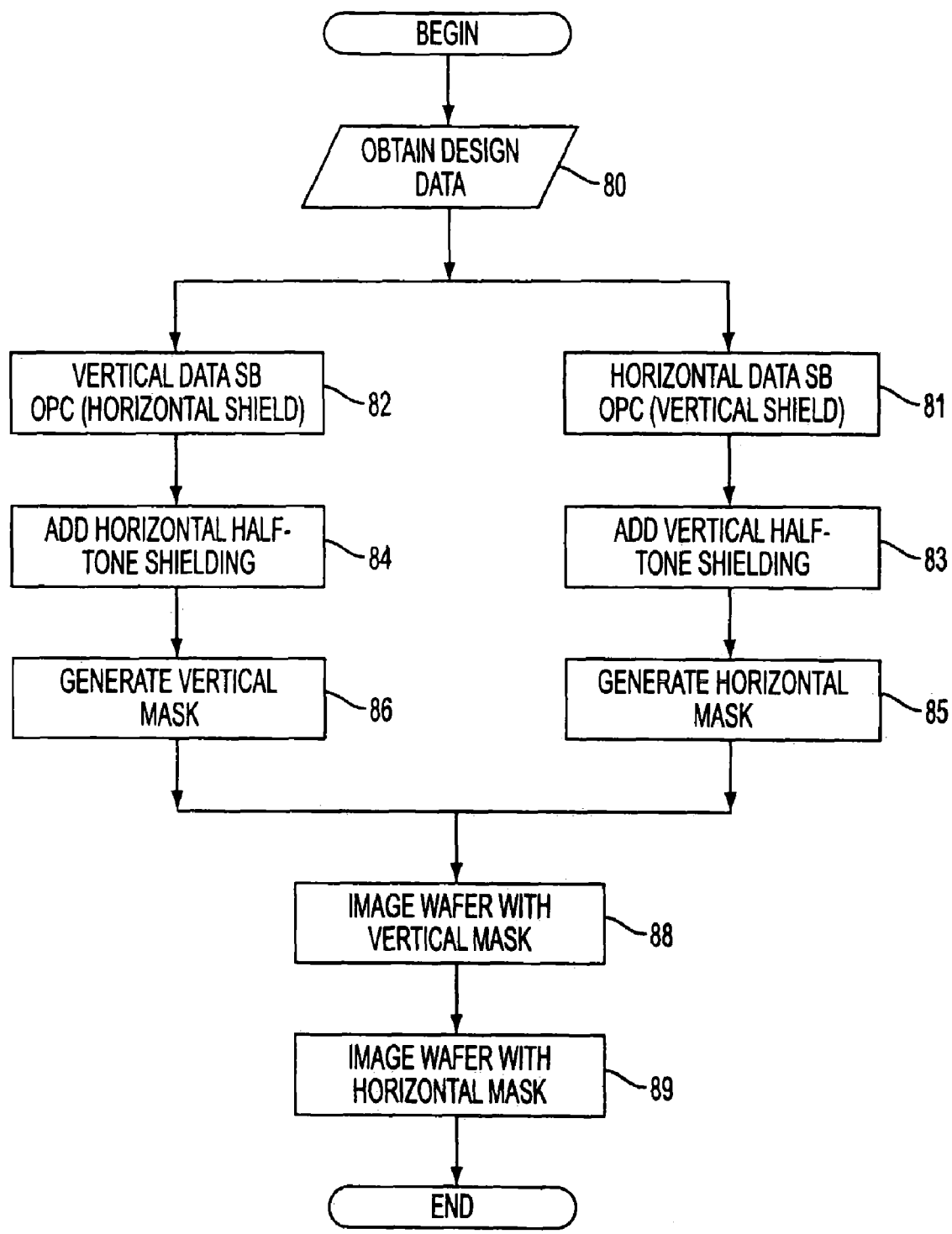
FIG. 7 illustrates an exemplary flow-chart illustrating the process of applying the shielding lines to mask patterns in accordance with the present invention.

FIG. 7 contains a flow-chart illustrating the process of applying the shielding lines to mask patterns in accordance with the present invention. Referring to FIG. 7, the first step (Step 80) entails obtaining the design data representing the pattern to be imaged. Then, the vertical features contained in the mask design are identified and any necessary OPC techniques (e.g., addition of scatter bars) are applied to the design (Step 82). During, Step 82 the horizontal features contained in the mask design are shielded in the manner discussed above. Next, in Step 84, the background areas of the mask pattern are identified and horizontally oriented, non-resolvable shielding lines 72 are added to the mask design. Once the shielding lines 72 are added, the design of the vertical mask is completed, and the vertical mask is generated (Step 86).

On rule of thumb regarding defining the "background" area is to add a "guard band" of approximately 10 times the wavelength of the exposure tool. SGB shielding is not disposed in this guardband. For example, assuming an Arf exposure tool having a wavelength of 193 nm, the guardband would be 193 nm×10 or approximately 2000 nm. As such, all areas outside of the 2000 nm guardband would be provided with the SGB shielding.

The horizontal mask is generated in a similar manner. Specifically, the horizontal features contained in the mask design are identified and any necessary OPC techniques (e.g., addition of scatter bars) are applied to the design (Step 81). During, Step 81 the vertical features contained in the mask design are shielded in the manner discussed above. Next, in Step 83, the background areas of the mask pattern are identified and vertically oriented, non-resolvable shielding lines 72 are added to the mask design. Once the shielding lines 72 are added, the design of the horizontal mask is complete and the horizontal mask is generated (Step 85).

Once the vertical and horizontal masks are generated, the final steps entail imaging the wafer utilizing the vertical mask and the X-pole illumination (Step 88), and thereafter imaging the wafer utilizing the horizontal mask and the Y-pole illumination (Step 89). Upon completion of Steps 88 and 89, the process is complete. Of course, it is also possible to perform steps 88 and 89 in the reverse, order.

Figure 8:
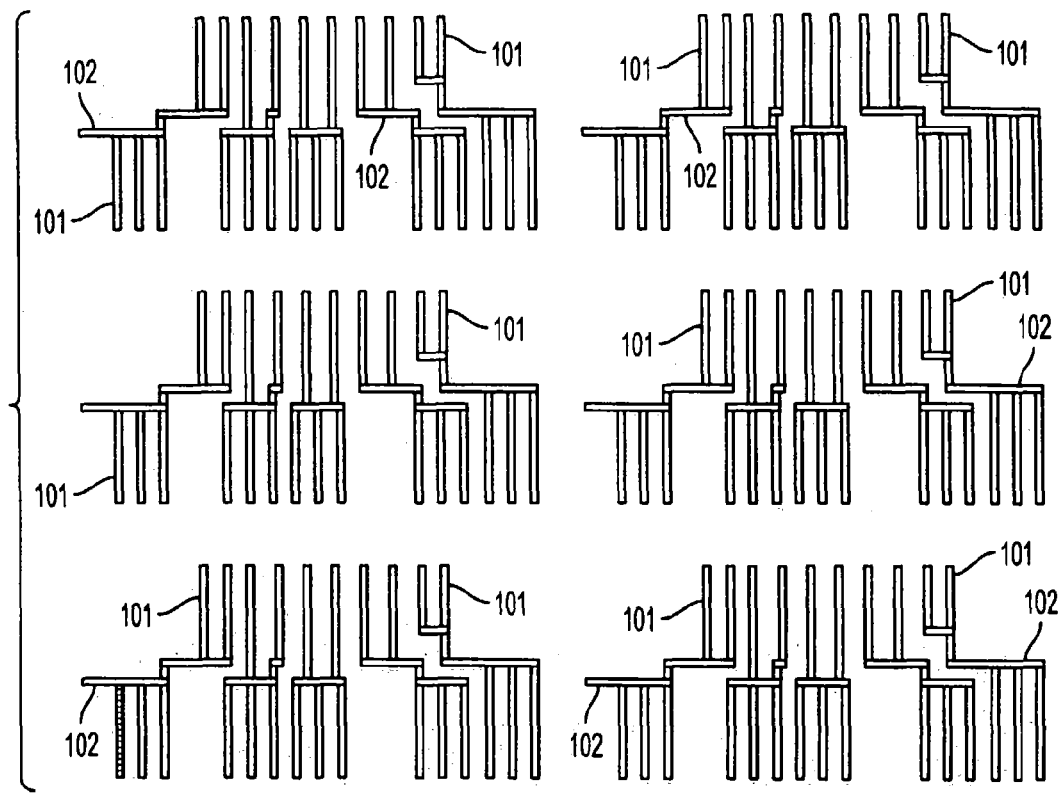
FIG. 8 illustrates an exemplary target pattern to be imaged on a wafer.
Figures 9A, 9B:
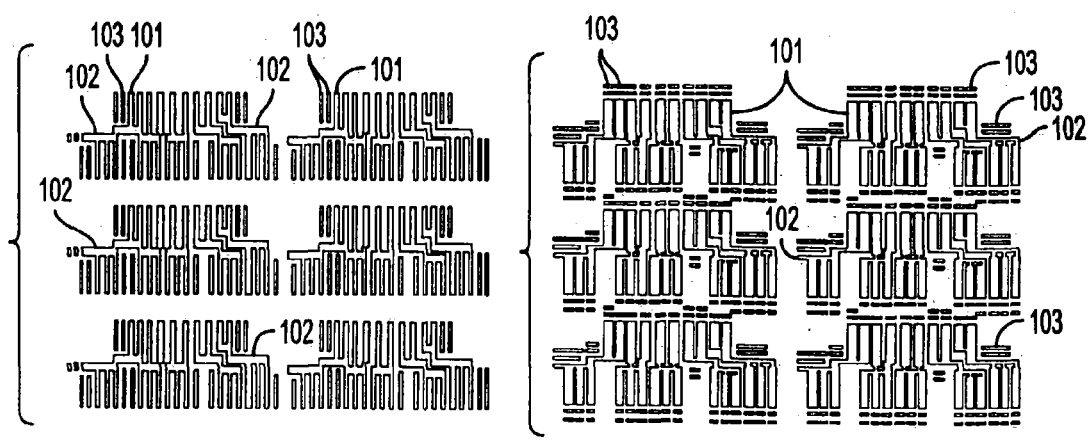
FIGS. 9a and 9b illustrate the vertical component pattern and the horizontal component pattern corresponding to the target pattern of FIG. 8, with shielding and OPC assist features applied thereto.

FIGS. 8–10 illustrate the process and exemplary masks patterns that are generated in accordance with the method of the present invention. An exemplary target pattern to be imaged on a wafer is illustrated in FIG. 8. As shown, the target pattern contains both vertically oriented features 101 and horizontally oriented features 102. FIG. 9a illustrates the result of Step 82. As shown, the horizontal features 102 are shielded, and assist features 103 are added to the vertical features 101 to be printed where necessary. FIG. 9b illustrates the result of Step 81. As shown, the vertical features 101 are shielded, and assist features 103 are added to the horizontal features 102 to be printed where necessary.

It is further noted that within the original mask pattern illustrated in FIG. 8, there is a non-uniform distribution of geometry's and pattern coverage is only 9% (i.e., only 9% of the total area of the given mask has features to be printed). Further, after decomposition of the original pattern into the vertical and horizontal mask patterns and application of OPC techniques as shown in FIGS. 9a and 9b, respectively, the resulting layouts still have uneven spatial distributions. However, pattern coverage is improved from 9% to 13.6% for the vertical layout (FIG. 9a) and to 17.3% for the horizontal layout (FIG. 9b). Thus, after decomposition into horizontal and vertical mask patterns, there is still a large open area without any protection that will suffer from the flare of the exposure system.

Figure 10A:
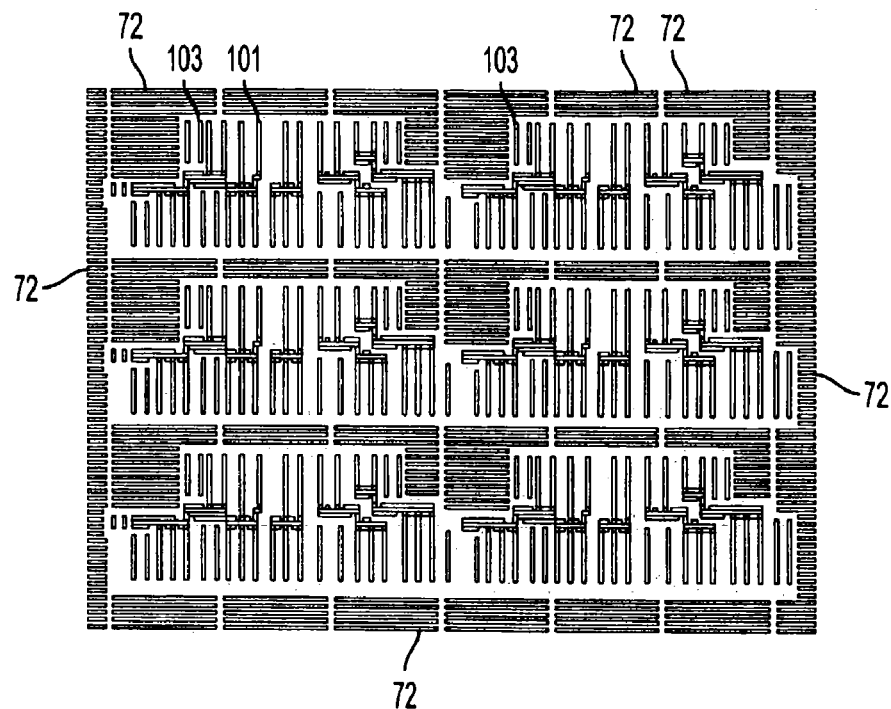
FIGS. 10a and 10b illustrate the SGB applied to the vertical component pattern and the horizontal component pattern illustrated in FIGS. 9a and 9b.
Figure 10B:
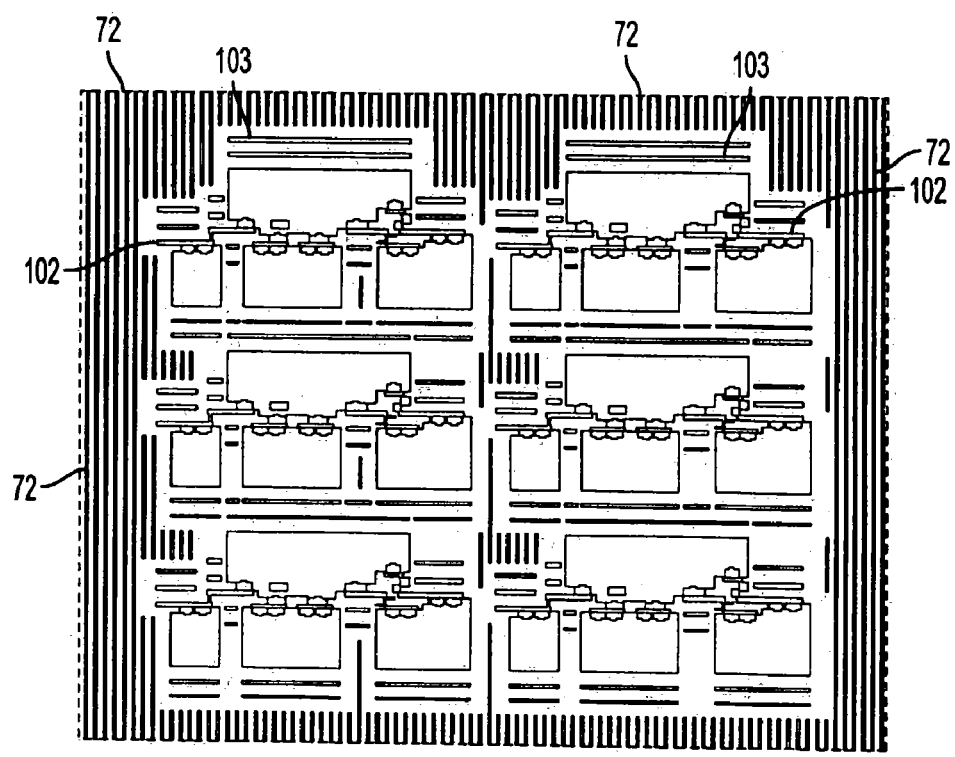

FIGS. 10a and 10b illustrate the results of Step 84 and Step 83, respectively. As shown in FIG. 10a, non-resolvable horizontally oriented shielding lines 72 are added to the vertical pattern in the open background areas (Step 84). Similarly, as shown in FIG. 10b, non-resolvable vertically oriented shielding lines 72 are added to the horizontal pattern in the open background areas (Step 83). As noted above, the background shielding does not result in an intensity modulation in either the X-pole or Y-pole illumination. Further, after applying the shielding lines, the pattern coverage improves form 13.6% to 30% for the vertical layout (FIG. 10a) and from 17.3% to 35% for the horizontal layout (FIG. 10b). The table illustrated in FIG. 11 summarizes the increase in pattern coverage for the various patterns illustrated in FIGS. 8–10. It is noted that the higher the percentage of pattern coverage means that the SGB treatment is blocking more stray light, and as a result, further reducing the negative effects of flare.

Figure 12B:
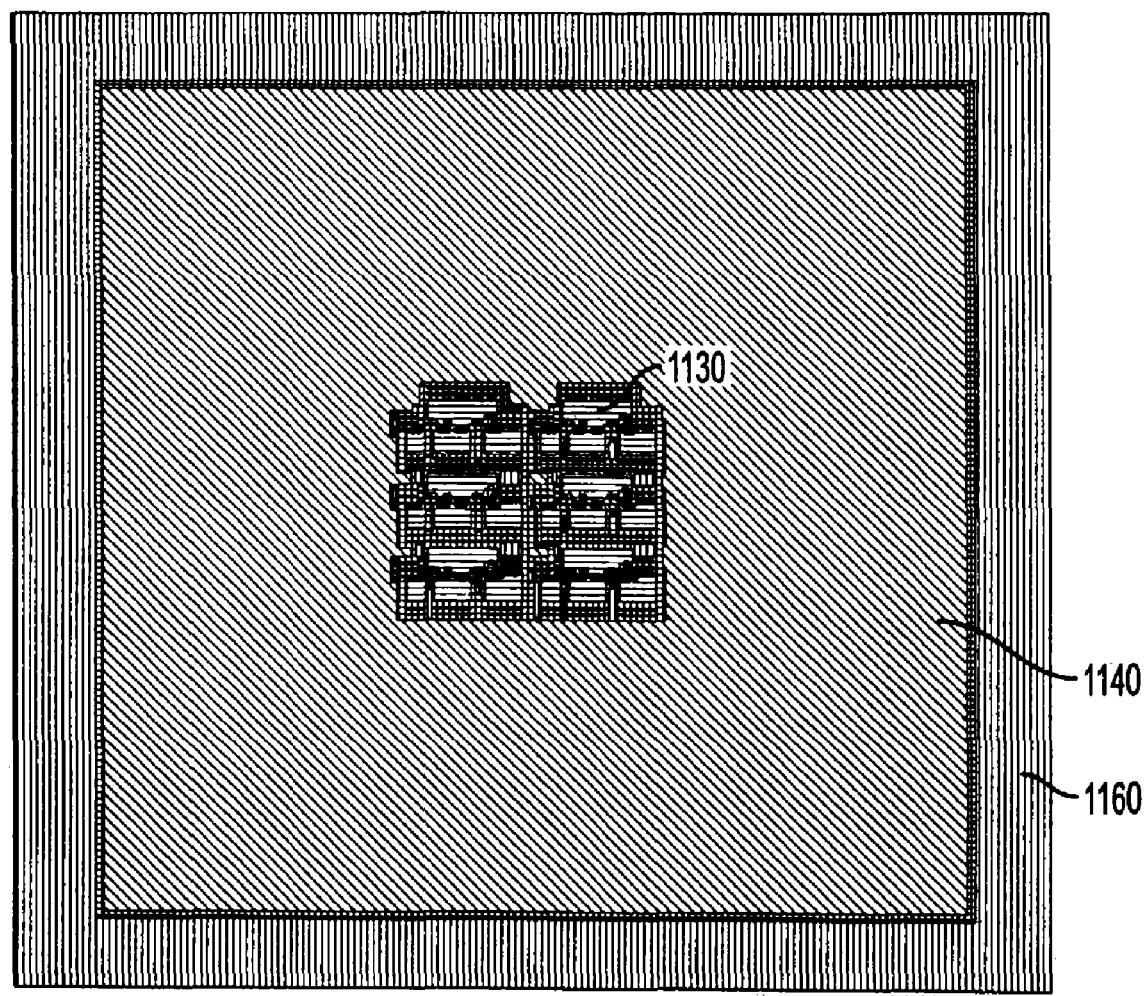

FIGS. 12a and 12b illustrate the results of an aerial image simulation utilizing the vertical and horizontal masks shown in FIGS. 10a and 10b, respectively, containing SGB shielding in the double dipole exposure process. As shown in FIG. 12a, the resulting normalized intensity levels associated with the various portions of the resulting intensity are as follows: area 1120, which corresponds to the main feature shielding area, 0%; area 1130, which corresponds to a portion of the circuit structure 25%; area 1140, which corresponds to area covered by the SGB shielding 50%; and area 1160, which corresponds to an area without any shielding, 100%. As is shown, the areas 1140 covered by the horizontal SGB shielding have a relative intensity level which is 50% lower than the areas 1160 having no shielding. As a result, the SGB shielding can effectively reduce the amount of background light. FIG. 12b illustrates similar results for the horizontal mask.

Figure 1:
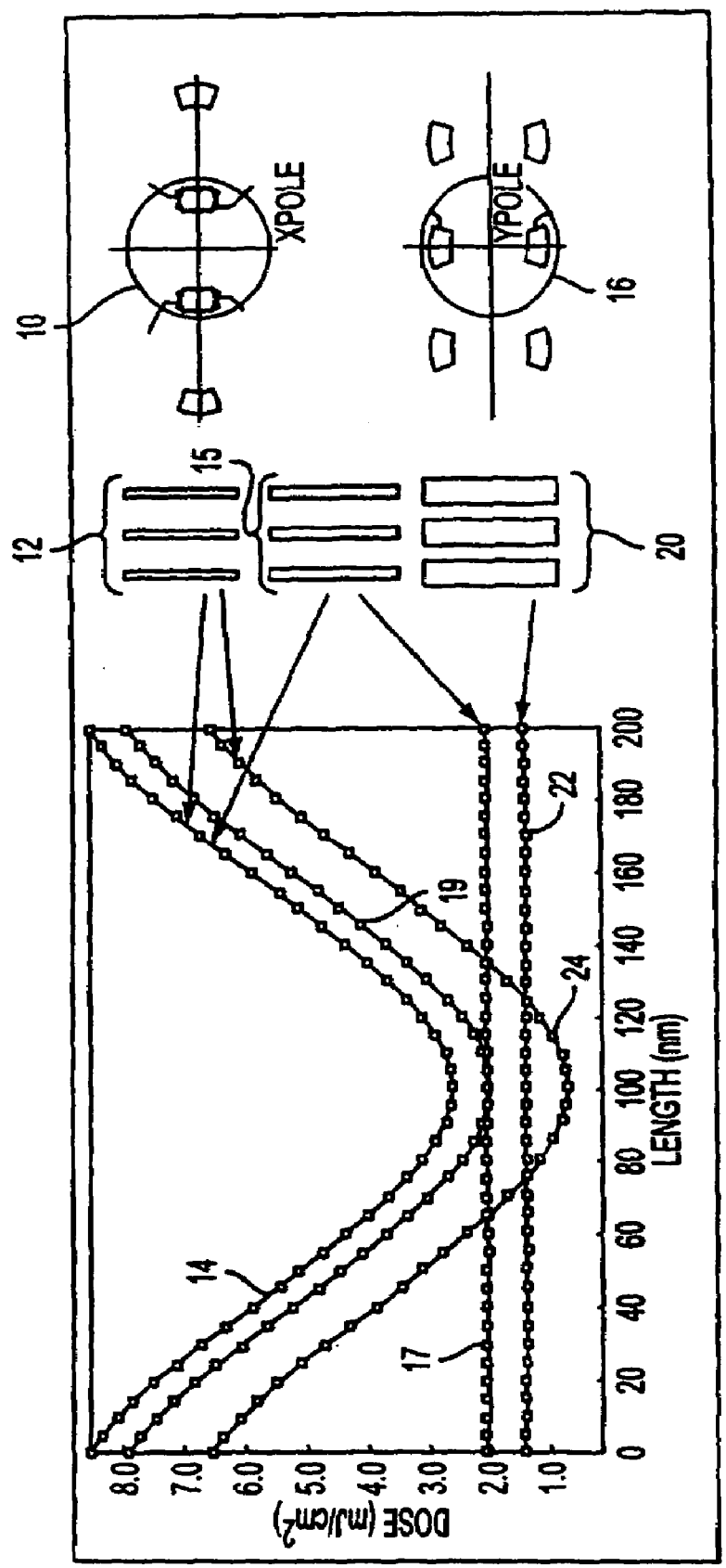
FIG. 1 illustrates the effects of shielding on the aerial image resulting from dipole illumination.
Figure 2A:
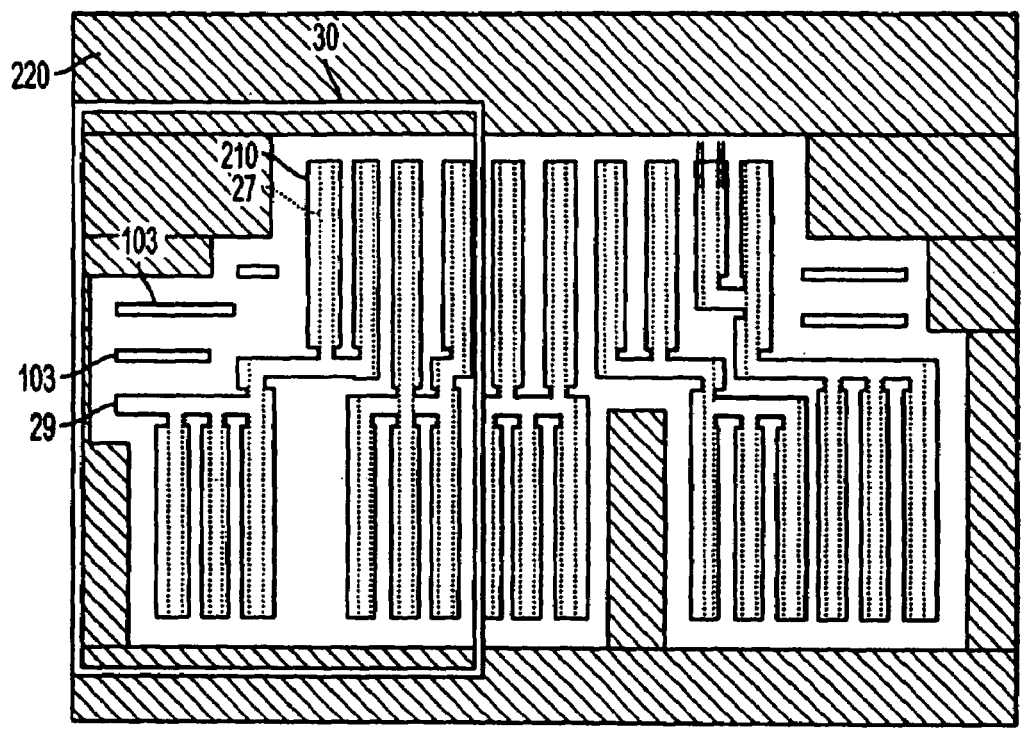
FIGS. 2a and 2b illustrate examples of fully solid shielded masks for printing vertical features and horizontal features, respectively.
Figure 2B:
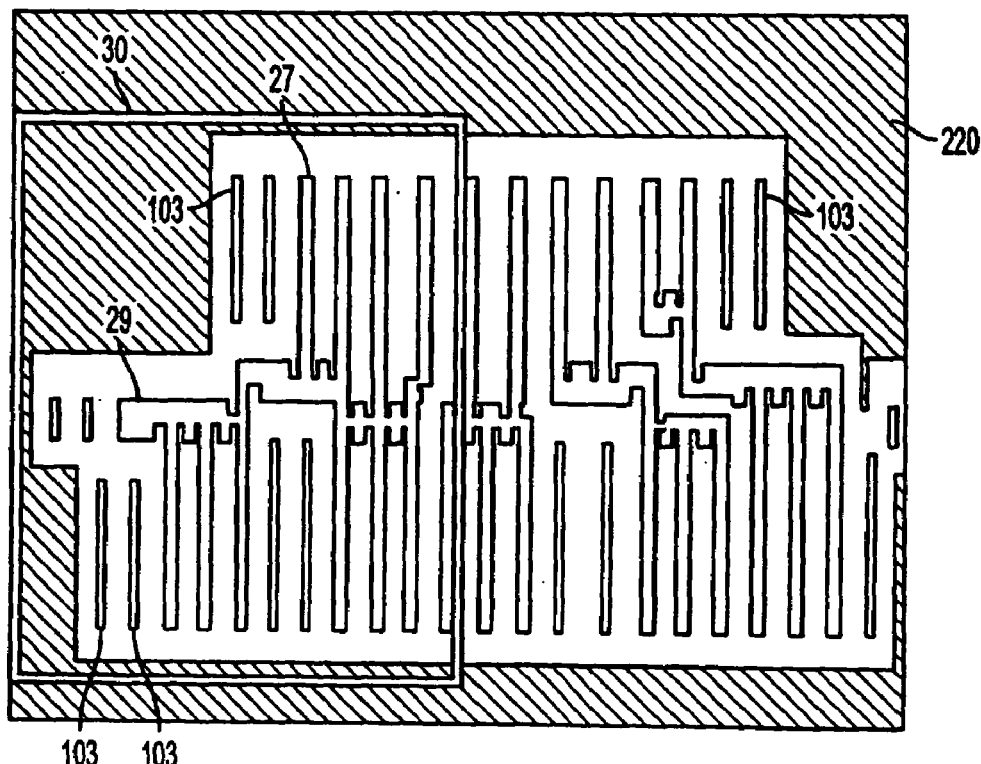
Figure 3B:
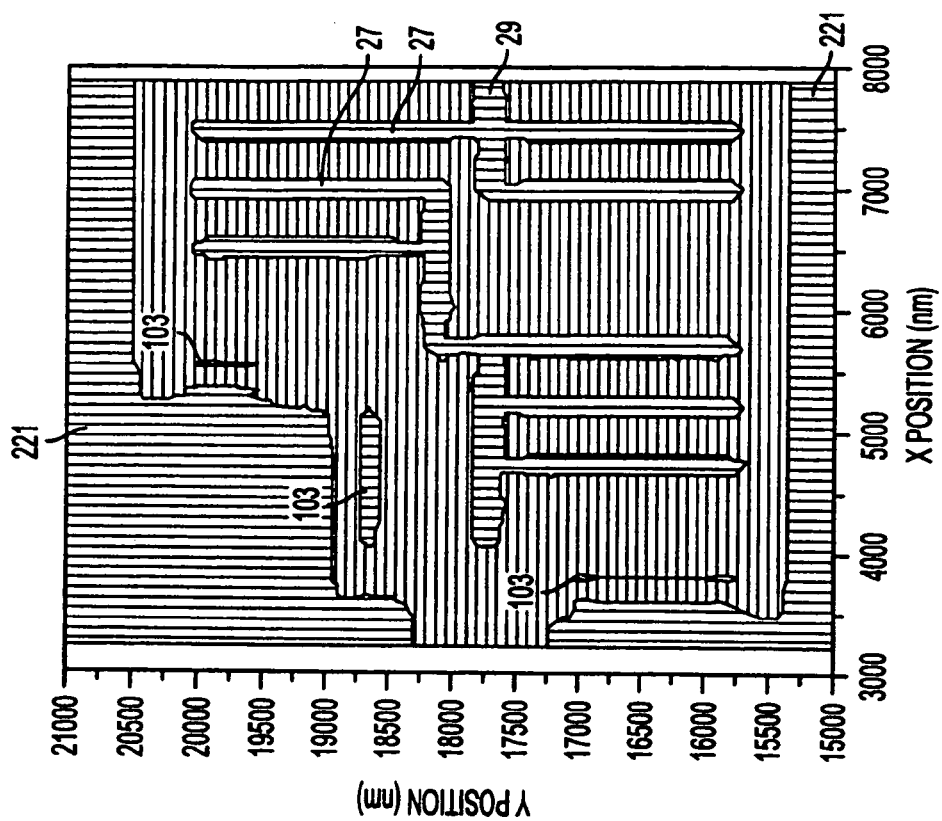
FIGS. 3a and 3b illustrate a simulated resist pattern corresponding to the masks of FIGS. 2a and 2b.
Figure 3A:
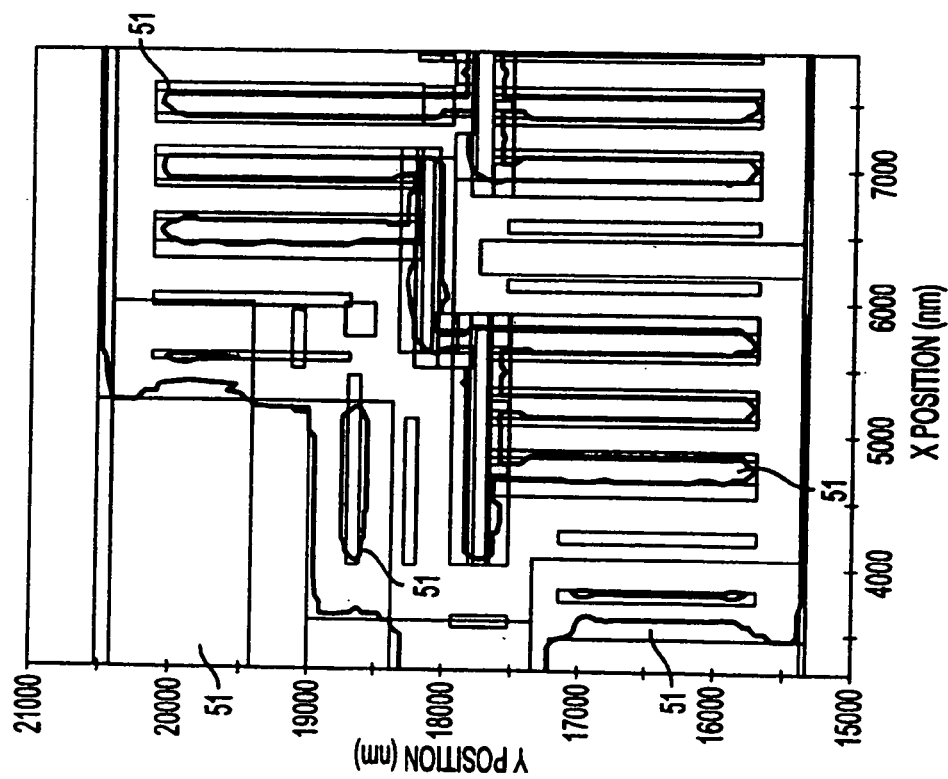

FIGS. 13a and 13b illustrate the results of a full resist model simulation for the portion of the mask pattern contained in area 30 as illustrated in FIGS. 2a and 2b. The SGB lines applied to the vertical and horizontal mask patterns have a pitch of 120 nm and a width of 40 nm. As shown in FIGS. 13a and 13b, the shielding lines 72 added to the mask patterns do not interfere with the scatter bar placement, nor do the shielding lines 72 cause the scatter bars to print.

Figure 14B:
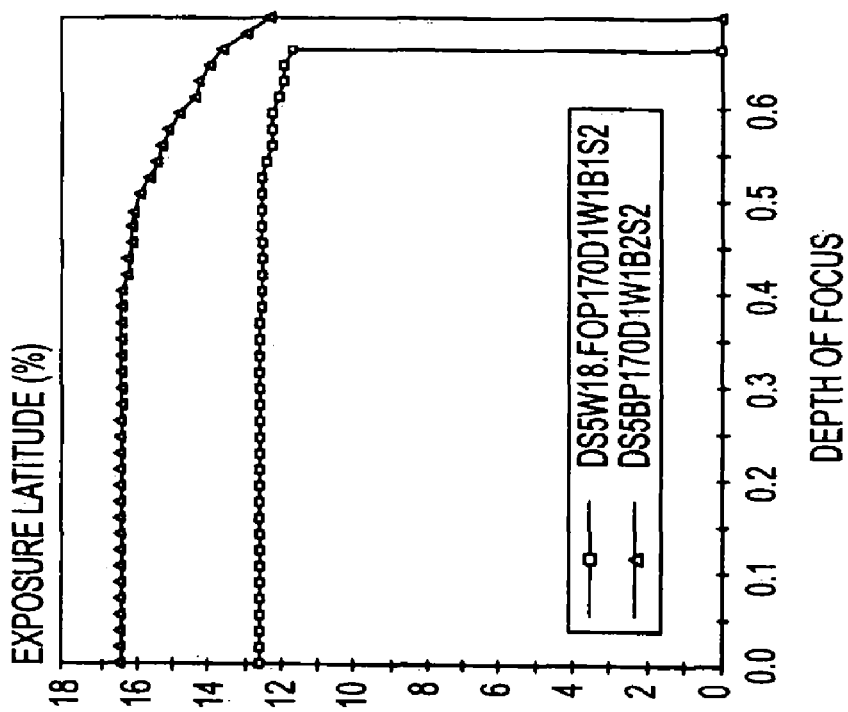
FIGS. 14a and 14b illustrates an improvement obtained in exposure latitude obtained as a result of the use of SGB shielding.
Figure 14A:
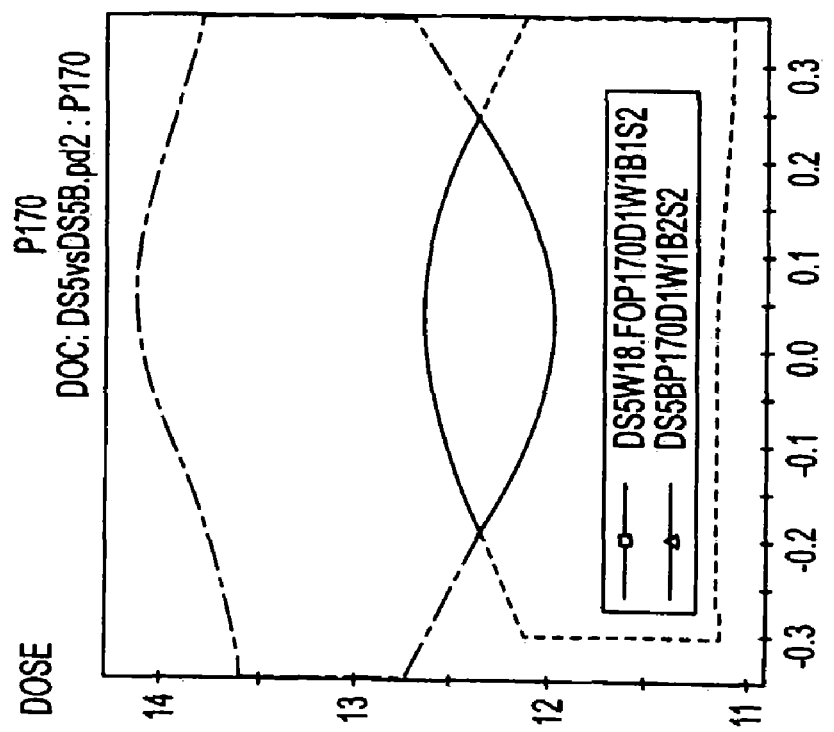

The effectiveness of the SGB of the present invention was validated by exposing two sets of dipole reticles, one with SGB and one without, with an ASML PAS5500/1100 ArF, 0.75 NA step-and-scan system using the same resist process. The double dipole exposure setting were: NA=0.75, 35° opening, $\sigma_{inner}$=0.64 and $\sigma_{outer}$=0.89. This illumination setting was optimized for a pitch of 170 nm, given by pitch=$\lambda$/($2\sigma_c$ NA), to maximize the $0^{th}$ and +/-$1^{st}$ diffraction order overlap for maximizing the depth of focus (DOF), where $\sigma_c$=($\sigma_{inner}$+$\sigma_{outer}$)/2. And because stray light has a bigger impact on dense pitches, the validation focused on the 70 nm target CD with 170 nm pitch. FIGS. 14a and 14b illustrate that the reticle with the SGB (DS5B) required a higher dose to achieve the 70 nm target CD and had a 20% improvement in exposure latitude as compared to the DS5 reticle without SGB. These experimental results confirm that the use of SGB can effectively reduce stray light, and improve image contrast and enhance process latitude.

Figure 15C:
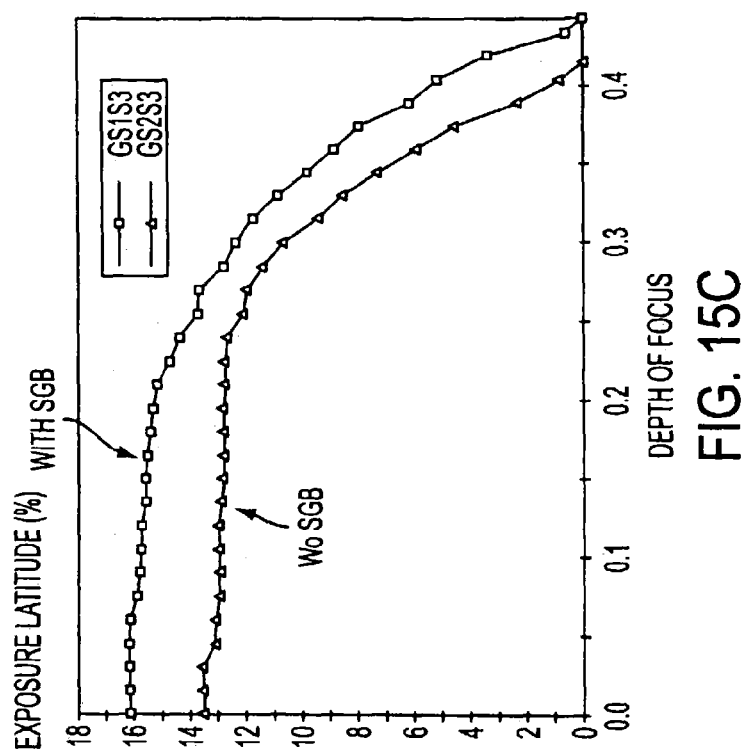
FIGS. 15a–15c illustrate how SGB impacts the process latitude or real device.
Figure 15B:
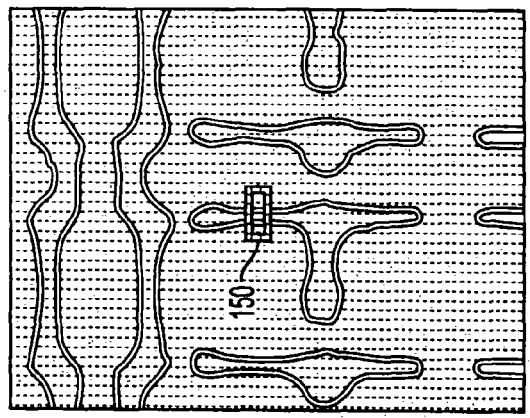
Figure 15A:
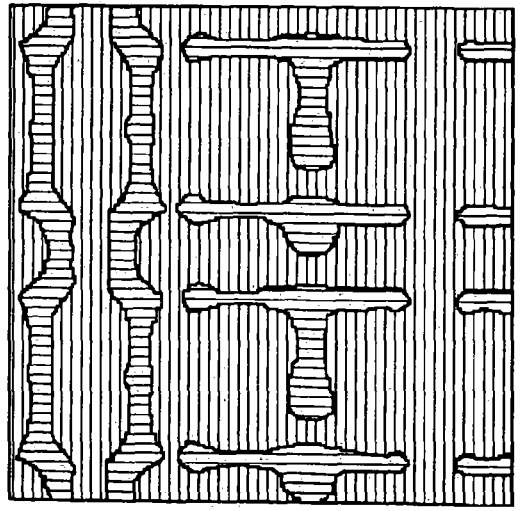

To confirm how SGB impacts the process latitude of real devices, the SGB was utilized in the fabrication of a SRAM cell. FIGS. 15a–15c illustrate the results. CD measurements were performed at the 65 nm NMOS gate. The rectangle 150 in FIG. 15b marks the FEM CD measurement location. As shown in FIG. 15c, the SRAM treated with SGB exhibits approximately 20% more exposure latitude that the SRAM not treated with SGB. It is noted that the resist simulation and the SEM resist image are shown in FIGS. 15a and 15b, respectively.

As a final test, Joseph Kirk's disappearing box test was modified for double exposure to quantify the amount of flare with and without the use of the SGB pattern. The disappearing box module was designed with box sized varying from 0.6 um to 5.0 um. The modules was placed at the exact location on both the horizontal and vertical reticles. The same box array was treat with SGB 1 mm in length and each box was placed 3 mm apart. The percentage of flare was calculated using the following equation:

Straylight %=$E_0$(dose to clear)/$E_{box}$(dose to remove)

Figure 16:
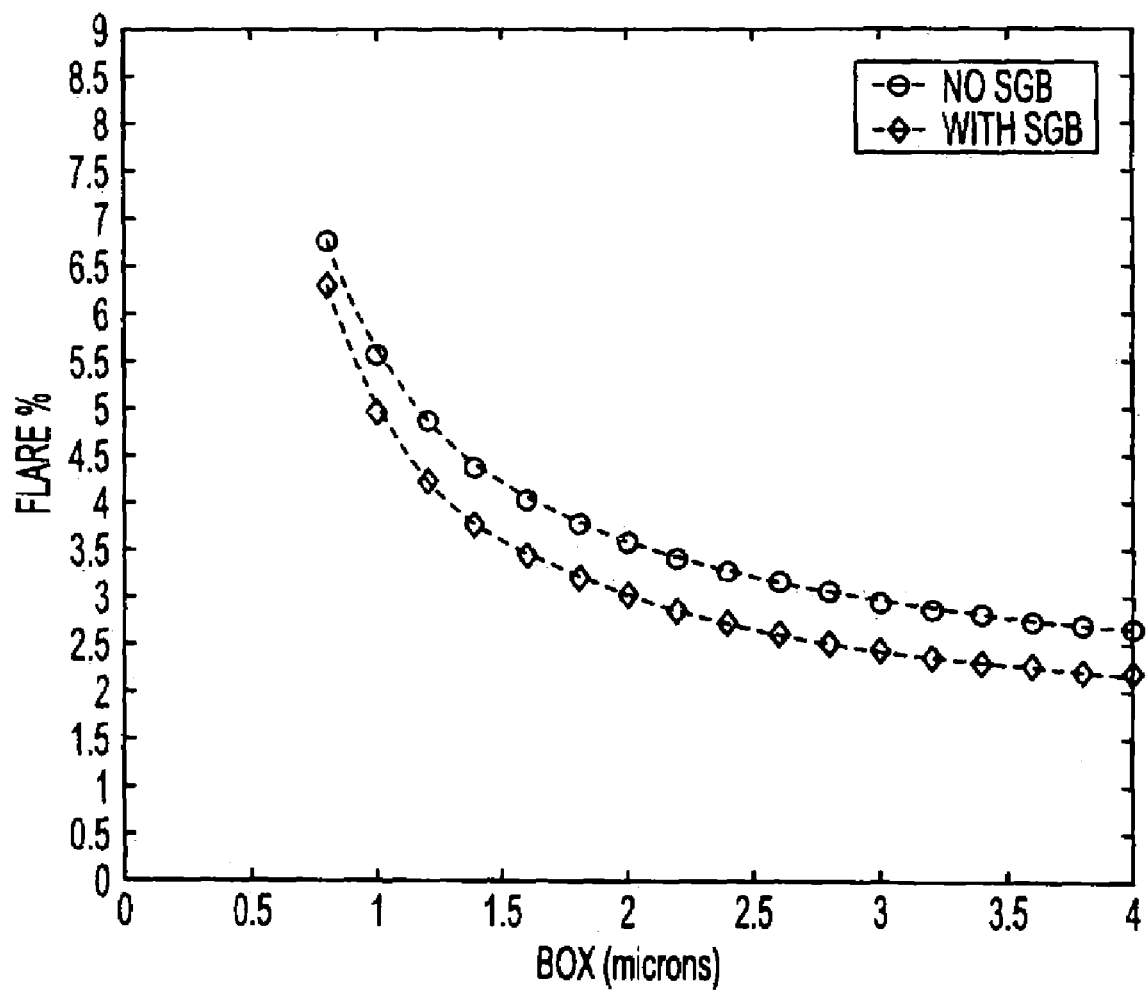
FIG. 16 illustrates the results of "Kirk's" disappearing box test quantifying the amount of flare with and without the use of SGB of the present invention.

FIG. 16 illustrates the test results. The disappearing box array with SGB has approximately 1.5% lower flare overall (or approximately 33% improvement). It is noted that flare is very sensitive to the surrounding environment, especially in the range where the SGB converges to the non-SGB result. The amount of flare reduction depends on the range of SGB. A longer SGB range will result in a better flare reduction.

It is noted that-as discussed above, the foregoing process of the present invention for generating the vertical and horizontal masks is typically performed utilized CAD systems in conjunction with mask generating software, such as MaskWeaver™ sold by ASML MaskTools. Such CAD systems and mask design software can be readily program to include the process of the present invention.

Figure 17:
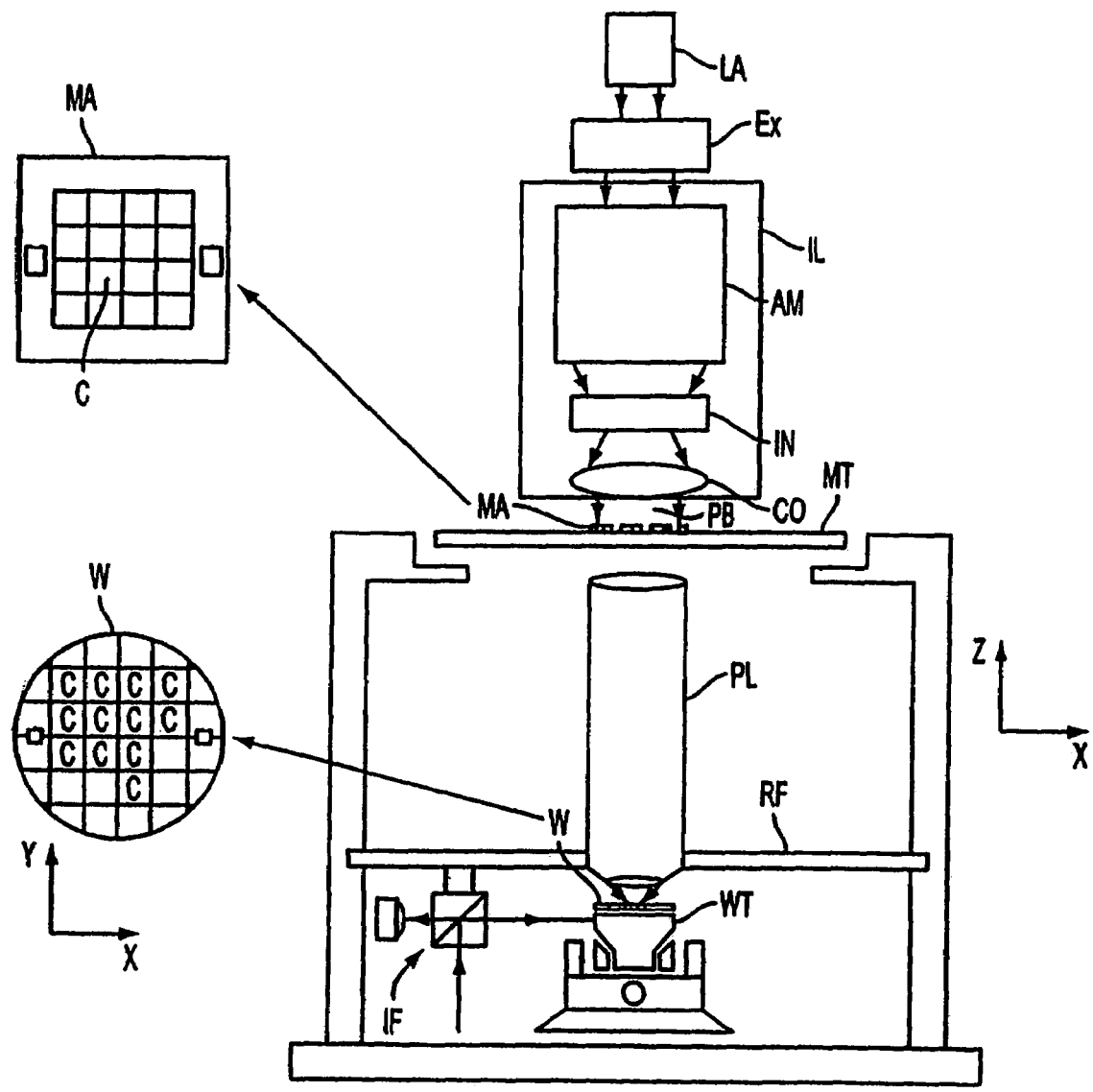
FIG. 17 schematically depicts a lithographic projection apparatus suitable for use with the masks designed with the aid of the current invention.

FIG. 17 schematic ally depicts a lithographic projection apparatus suitable for use with the masks designed with the aid of the current invention. The apparatus comprises:

a radiation system Ex, IL, for supplying a projection beam PB of radiation. In this particular case, the radiation system also comprises a radiation source LA;

a first object table (mask table) MT provided with a mask holder for holding a mask MA (e.g. a reticle), and connected to first positioning means for accurately positioning the mask with respect to item PL;

a second object table (substrate table) WT provided with a substrate holder for holding a substrate W (e.g. a resist-coated silicon wafer), and connected to second positioning means for accurately positioning the substrate with respect to item PL;

a projection system ("lens") PL (e.g. a refractive, catoptric or catadioptric optical system) for imaging an irradiated portion of the mask MA onto a target portion C (e.g. comprising one or more dies) of the substrate W.

As depicted herein, the apparatus is of a transmissive type (i.e. has a transmissive mask). However, in general, it may also be of a reflective type, for example (with a reflective mask). Alternatively, the apparatus may employ another kind of patterning means as an alternative to the use of a mask; examples include a programmable mirror array or LCD matrix.

The source LA (e.g. a mercury lamp, excimer laser or plasma discharge source) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 17 that the source LA may be within the housing of the lithographic projection apparatus (as is often the case when the source LA is a mercury lamp, for example), but that it may also be remote from the lithographic projection apparatus, the radiation beam that it produces being led into the apparatus (e.g. with the aid of suitable directing mirrors); this latter scenario is often the case when the source LA is an excimer laser (e.g.

based on KrF, ArF or $F_2$ lasing). The current invention encompasses both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the mask MA with respect to the path of the beam PB, e.g. after mechanical retrieval of the mask MA from a mask library, or during, a scan. In general, movement of the object tables MT, WT will be realized with the aid of a long-stroke module (coarse positioning) and a short-stroke module (fine positioning), which are not explicitly depicted in FIG. 17. However, in the case of a wafer stepper (as opposed to a step-and-scan tool) the mask table MT may just be connected to a short stroke actuator, or may be fixed.

The depicted tool can be used in two different modes:

In step mode, the mask table MT is kept essentially stationary, and an entire mask image is projected in one go (i.e. a single "flash") onto a target portion C. The substrate table WT is then shifted in the x and/or y directions so that a different target portion C can be irradiated by the beam PB;

In scan mode, essentially the same scenario applies, except that a given target portion C is not exposed in a single "flash". Instead, the mask table MT is movable in a given direction (the so-called "scan direction", e.g. the y direction) with a speed-v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

As described above, the method of the present invention provides important advantages over the prior art. For example, the present invention provides an effective technique for reducing long-range flare light so as to minimize the impact of flare in the exposure process. Importantly, the technique of the present invention does not interfere with the placement of assist features, nor does it cause the assist features to print. Further, the method of the present invention does not result in an increase in the number of masks required during the imaging process.

Figure 18B:
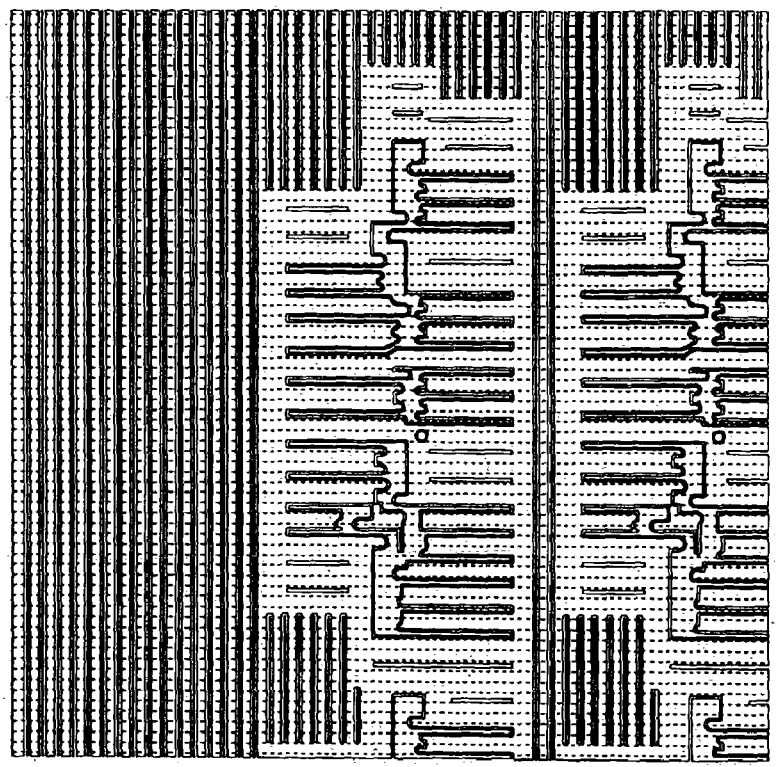
FIGS. 18a and 18b illustrate the use of continuous SGB lines that span the length of the exposure field.
Figure 18A:
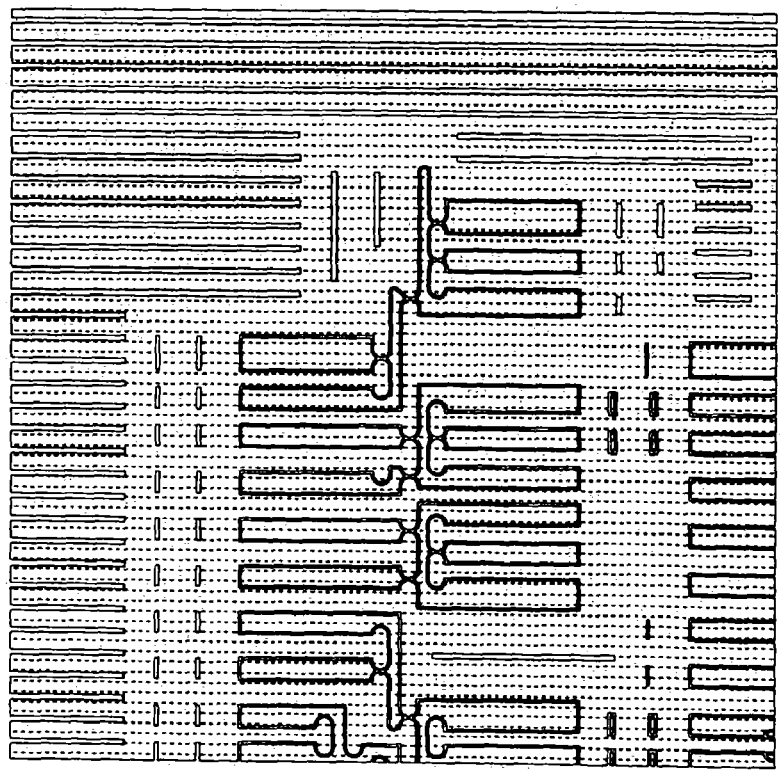

In addition variations to the embodiment set forth above are also possible. For example, while the SGB lines illustrated in FIGS. 10a and 10b are discontinuous, it is also possible to have continuous lines or other shapes, for example, but not limited to square, circular, etc. so long as the shielding geometries remain sub-resolution as shown for example in FIGS. 18a and 18b. The use of such continuous, long lines in the SGB shield has the additional benefit of reducing the data volume associated with the masks.

In another variation, while not preferable, it is also possible to form the SGB such that the lines contained therein align with the features being printed. However, in such an embodiment, the SGB is in the high contrast orientation, and therefore the printability of the SGB is increased.

Although certain specific embodiments of the present invention have been disclosed, it is noted that the present invention may be embodied in other forms without departing from the spirit or essential characteristics thereof. The present embodiments are therefore to be considered in all respects as illustrative and not restrictive, the scope of the invention being indicated by the appended claims, and all changes that come within the meaning and range of equivalency of the claims are therefore intended to be embraced therein.

We claim:

1. A method of generating masks for printing a pattern having vertically oriented features and horizontally oriented features on a substrate utilizing dipole illumination, said method comprising the steps of:
    identifying background areas contained in said pattern wherein said background areas do not contain any features to be imaged on said substrate;
    generating a vertical component mask using a sub-resolution grating block comprising non-resolvable horizontally oriented features in said background areas; and
    generating a horizontal component mask using a sub-resolution grating block comprising non-resolvable vertically oriented features in said background areas, wherein said non-resolvable horizontally oriented features and said non-resolvable vertically oriented features significantly reduce the negative effects of lens flare and improve dipole imaging performance.

2. The method of generating masks according to claim 1, wherein said step of generating said vertical component mask includes:
    identifying horizontally oriented features contained in said pattern and providing shielding for said horizontally oriented features; and
    applying optical proximity correction assist features to vertically oriented features contained in said pattern, said vertical component mask being utilized to image said vertically oriented features on said substrate.

3. The method of generating masks according to claim 1, wherein said step of generating said horizontal component mask includes:
    identifying vertically oriented features contained in said pattern and providing shielding for said vertically oriented features; and
    applying optical proximity correction assist features to horizontally oriented features contained in said pattern, said horizontal component mask being utilized to image said horizontally oriented features on said substrate.

4. The method of generating masks according to claim 1, wherein said non-resolvable horizontally oriented features comprise a plurality of individual lines extending parallel to one another, each of said individual lines having the same width.

5. The method of generating masks according to claim 4, wherein said non-resolvable horizontally oriented features have the same pitch.

6. The method of generating masks according to claim 1, wherein said non-resolvable vertically oriented features comprise a plurality of individual lines extending parallel to one another, each of said individual lines having the same width.

7. The method of generating masks according to claim 6, wherein said non-resolvable vertically oriented features have the same pitch.

8. A method of printing a pattern having vertically oriented features and horizontally oriented features on a substrate utilizing dipole illumination, said method comprising the steps of:
    identifying background areas contained in said pattern wherein said background areas do not contain any features to be imaged on said substrate;
    generating a vertical component mask using a sub-resolution grating block comprising non-resolvable horizontally oriented features in said background areas;

generating a horizontal component mask using a sub-resolution grating block comprising non-resolvable vertically oriented features in said background areas, wherein said non-resolvable horizontally oriented features and said non-resolvable vertically oriented features significantly reduce the negative effects of lens flare and improve dipole imaging performance illuminating said vertical component mask utilizing an X-pole illumination; and illuminating said horizontal component mask utilizing a Y-pole illumination.

9. The method of printing a pattern according to claim 8, wherein said step of generating said vertical component mask includes:

identifying horizontally oriented features contained in said pattern and providing shielding for said horizontally oriented features; and applying optical proximity correction assist features to vertically oriented features contained in said pattern.

10. The method of printing a pattern according to claim 8, wherein said step of generating said horizontal component mask includes:

identifying vertically oriented features contained in said pattern and providing shielding for said vertically oriented features; and applying optical proximity correction assist features to horizontally oriented features contained in said pattern.

11. The method of printing a pattern according to claim 9, wherein said shielding prevents, illumination of said horizontally oriented components when said vertical component mask is illuminated.

12. The method of printing a pattern according to claim 10, wherein said shielding prevents illumination of said vertically oriented components when said horizontal component mask is illuminated.

13. The method of printing a pattern according to claim 8, wherein said non-resolvable horizontally oriented features comprise a plurality of individual lines extending parallel to one another, each of said individual lines having the same width.

14. The method of printing a pattern according to claim 13, wherein said non-resolvable horizontally oriented features-have the same pitch.

15. The method of printing a pattern according to claim 8, wherein said non-resolvable vertically-oriented features comprise a plurality of individual lines extending parallel to one another, each of said individual lines having the same width.

16. The method of printing a pattern according to claim 15, wherein said non-resolvable vertically oriented features have the same pitch.

17. An apparatus for generating masks for printing a pattern having vertically oriented features and horizontally oriented features-on a substrate, said apparatus comprising:

means for identifying background areas contained in said pattern wherein said background areas do not contain any features to be imaged on said substrate;

means for generating a vertical component mask using a sub-resolution grating block comprising non-resolvable horizontally oriented features in said background areas; and means for generating a horizontal component mask using a sub-resolution grating block comprising non-resolvable vertically oriented features in said background areas, wherein said non-resolvable horizontally oriented features and said non-resolvable vertically oriented features significantly reduce the negative effects of lens flare and improve dipole imaging performance.

18. The apparatus of claim 17, wherein said non-resolvable horizontally oriented features comprise a plurality of individual lines extending parallel to one another, each of said individual lines having the same width.

19. The apparatus of claim 18, wherein said non-resolvable horizontally oriented features have the same pitch.

20. The apparatus of claim 17, wherein said non-resolvable vertically oriented features comprise a plurality of individual lines extending parallel to one another, each of said individual lines having the same width.

21. The apparatus of claim 20, wherein said non-resolvable vertically oriented features have the same pitch.

22. A computer program product for controlling a computer comprising a recording medium readable by the computer, means recorded on the recording medium for directing the computer to generate files corresponding to masks for printing a pattern having vertically oriented features and horizontally oriented features in a multiple-exposure lithographic imaging process, said generation of said files, which when executed by the computer, perform the steps comprising:

identifying background areas contained in said pattern wherein said background areas do not contain any features to be imaged on said substrate;

generating a vertical component mask using a sub-resolution grating block comprising non-resolvable horizontally oriented features in said background areas; and generating a horizontal component mask using a sub-resolution grating block comprising non-resolvable vertically oriented features in said background areas, wherein said non-resolvable horizontally oriented features and said non-resolvable vertically oriented features significantly reduce the negative effects of lens flare and improve dipole imaging performance.

23. The computer program product of claim 22, wherein the step of generating said vertical component mask includes:

identifying horizontally oriented features contained in said pattern and providing shielding for said horizontally oriented features; and applying optical proximity correction assist features to vertically oriented features contained in said pattern, said vertical component mask being utilized to image said vertically oriented features on said substrate.

24. The computer program product of claim 22, wherein said step of generating said horizontal component mask includes:

identifying vertically oriented features contained in said pattern and providing shielding for said vertically oriented features; and applying optical proximity correction assist features to horizontally oriented features contained in said pattern, said horizontal component mask being utilized to image said horizontally oriented features on said substrate.

25. The computer program product of claim 22, wherein said non-resolvable horizontally oriented features comprise a plurality of individual lines extending parallel to one another, each of said individual lines having the same width and the same pitch.

26. The computer program product of claim 22, wherein said non-resolvable vertically oriented features comprise a plurality of individual lines extending parallel to one another, each of said individual lines having the same width and the same pitch.

* * * * *